US006612026B1

(12) United States Patent
Fujita et al.

(10) Patent No.: US 6,612,026 B1
(45) Date of Patent: Sep. 2, 2003

(54) PROCESS FOR MOUNTING TERMINALS WITH ELECTRIC WIRES IN CAVITIES OF CONNECTOR HOUSINGS

(75) Inventors: Koji Fujita, Yokkaichi (JP); Yoshinobu Ota, Yokkaichi (JP); Junichi Shirakawa, Yokkaichi (JP); Kenji Hashimoto, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/513,333

(22) Filed: Feb. 25, 2000

(30) Foreign Application Priority Data

May 24, 1999 (JP) .......................................... 11-143090
May 24, 1999 (JP) .......................................... 11-143212
May 24, 1999 (JP) .......................................... 11-143448
May 24, 1999 (JP) .......................................... 11-143463

(51) Int. Cl.[7] ............................ H01R 9/00; H05K 3/00

(52) U.S. Cl. ............................ 29/842; 29/747; 29/748; 29/749; 29/753; 29/755; 29/759; 29/760; 29/857; 29/863; 29/872; 29/876

(58) Field of Search ......................... 29/747, 748, 749, 29/753, 755, 759, 760, 857, 863, 876, 872, 884, 842

(56) References Cited

U.S. PATENT DOCUMENTS 4,375,229 A 3/1983 Mikami et al. ............. 140/102
4,420,020 A * 12/1983 McGeary .................... 140/147
4,486,950 A * 12/1984 Weidler ....................... 29/866
4,492,023 A * 1/1985 Schneider .................... 29/861
4,590,650 A * 5/1986 Brown ...................... 29/33 M
4,837,926 A * 6/1989 Boutcher ..................... 29/747
5,082,253 A * 1/1992 Suzuki ........................ 269/45
5,127,159 A * 7/1992 Kudo .......................... 29/863
5,355,583 A * 10/1994 Osumi ......................... 29/876
5,606,795 A * 3/1997 Ohba .......................... 29/963
5,630,273 A 5/1997 Kobayashi et al. ........... 29/881
5,894,660 A * 4/1999 Kobayashi ................... 29/857
5,913,553 A 6/1999 Takada ........................ 29/861
6,296,240 B1 * 10/2001 Nakai .......................... 269/47

FOREIGN PATENT DOCUMENTS

| | | |
|---|---|---|
| EP | 833416 | 4/1998 |
| EP | 833417 | 4/1998 |
| EP | 844705 | 5/1998 |
| EP | 855767 | 7/1998 |
| EP | 862251 | 9/1998 |
| JP | 9-115642 | 5/1997 |
| JP | 10337042 | 11/1998 |
| JP | 10337249 | 11/1998 |
| JP | 10335037 | 12/1998 |
| JP | 10349947 | 12/1998 |
| JP | 10350013 | 12/1998 |
| PT | 102007 | 11/1997 |

OTHER PUBLICATIONS

English Language Abstract of JP 9–115642.
English Language Abstract of JP 10–335037.

* cited by examiner

*Primary Examiner*—Carl J. Arbes
*Assistant Examiner*—Paul Kim
(74) *Attorney, Agent, or Firm*—Greenblum & Bernstein, P.L.C.

(57) ABSTRACT

A process and system for mounting terminals with electric wires in cavities of connector housings. Press-connecting terminals are initially loaded in cavities arranged in an upper surface of a connector jig and electric wires are press-connected on the terminals in the jigs. Then, the terminals with electric wires are transferred from the connector jig to cavities arranged in a lower surface of a inserting jig by pins arranged to contact and push the terminals from below in the transfer direction. Then, the terminals are loaded from the inserting jig to cavities of connector housings from the back by blades arranged to contact and push the terminals from one end in the inserting directing.

13 Claims, 27 Drawing Sheets

FIG. 9
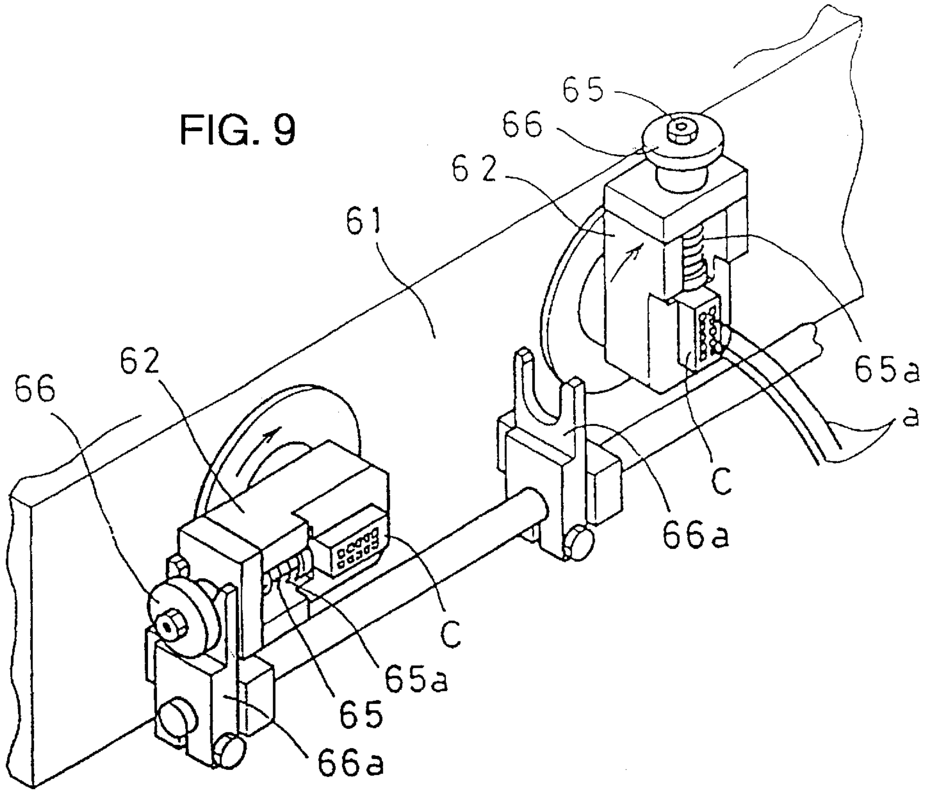
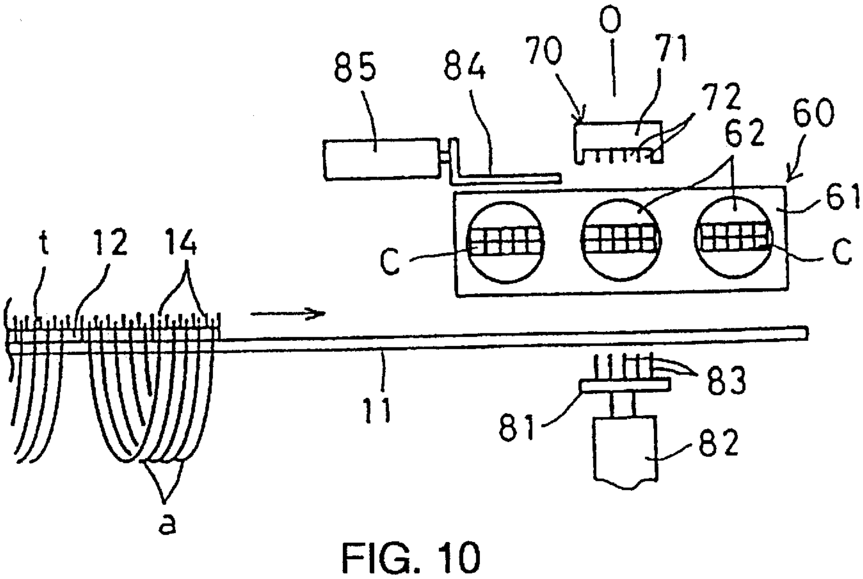
FIG. 10

FIG. 17(a)
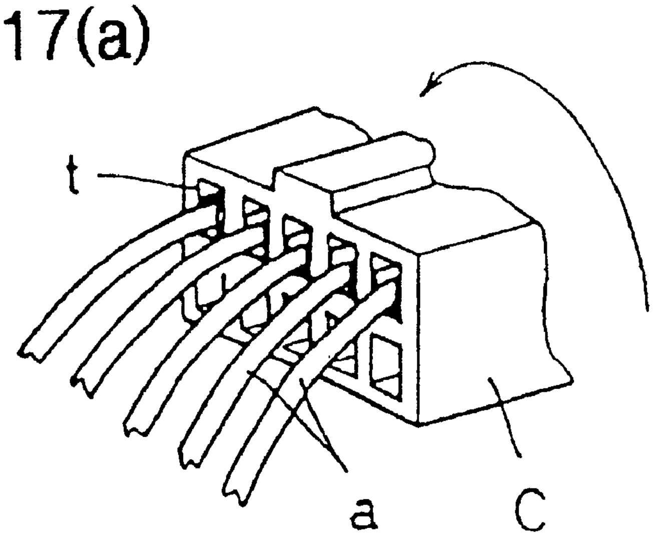
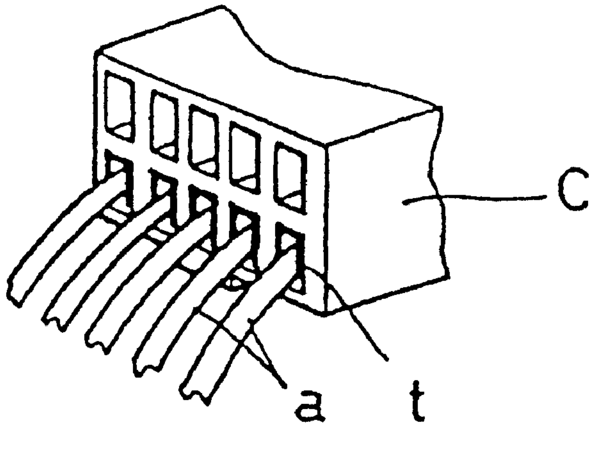
FIG. 17(b)

FIG. 20

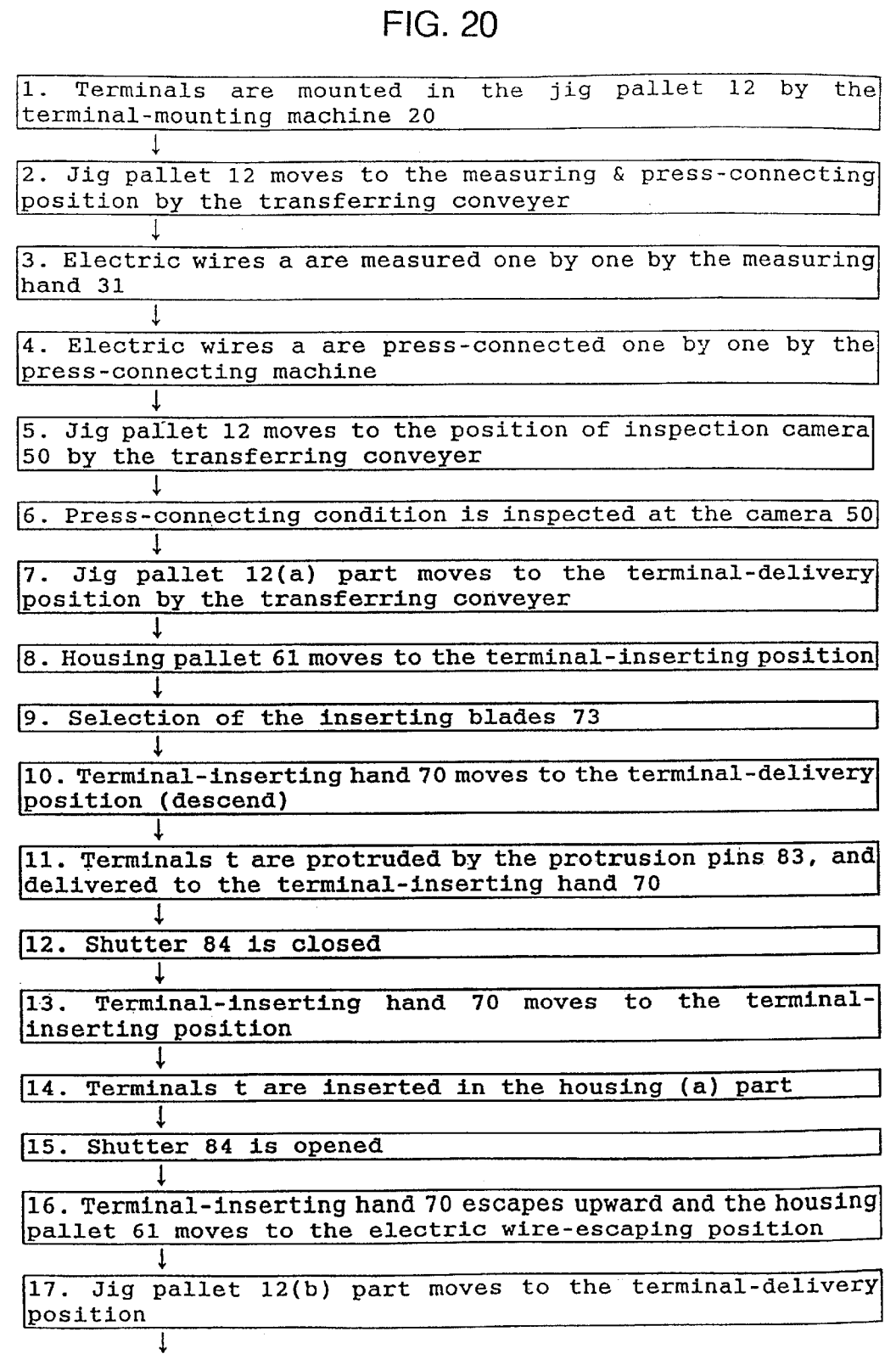

1. Terminals are mounted in the jig pallet 12 by the terminal-mounting machine 20

↓

2. Jig pallet 12 moves to the measuring & press-connecting position by the transferring conveyer

↓

3. Electric wires a are measured one by one by the measuring hand 31

↓

4. Electric wires a are press-connected one by one by the press-connecting machine

↓

5. Jig pallet 12 moves to the position of inspection camera 50 by the transferring conveyer

↓

6. Press-connecting condition is inspected at the camera 50

↓

7. Jig pallet 12(a) part moves to the terminal-delivery position by the transferring conveyer

↓

8. Housing pallet 61 moves to the terminal-inserting position

↓

9. Selection of the inserting blades 73

↓

10. Terminal-inserting hand 70 moves to the terminal-delivery position (descend)

↓

11. Terminals t are protruded by the protrusion pins 83, and delivered to the terminal-inserting hand 70

↓

12. Shutter 84 is closed

↓

13. Terminal-inserting hand 70 moves to the terminal-inserting position

↓

14. Terminals t are inserted in the housing (a) part

↓

15. Shutter 84 is opened

↓

16. Terminal-inserting hand 70 escapes upward and the housing pallet 61 moves to the electric wire-escaping position

↓

17. Jig pallet 12(b) part moves to the terminal-delivery position

↓

FIG. 20 (Cont)

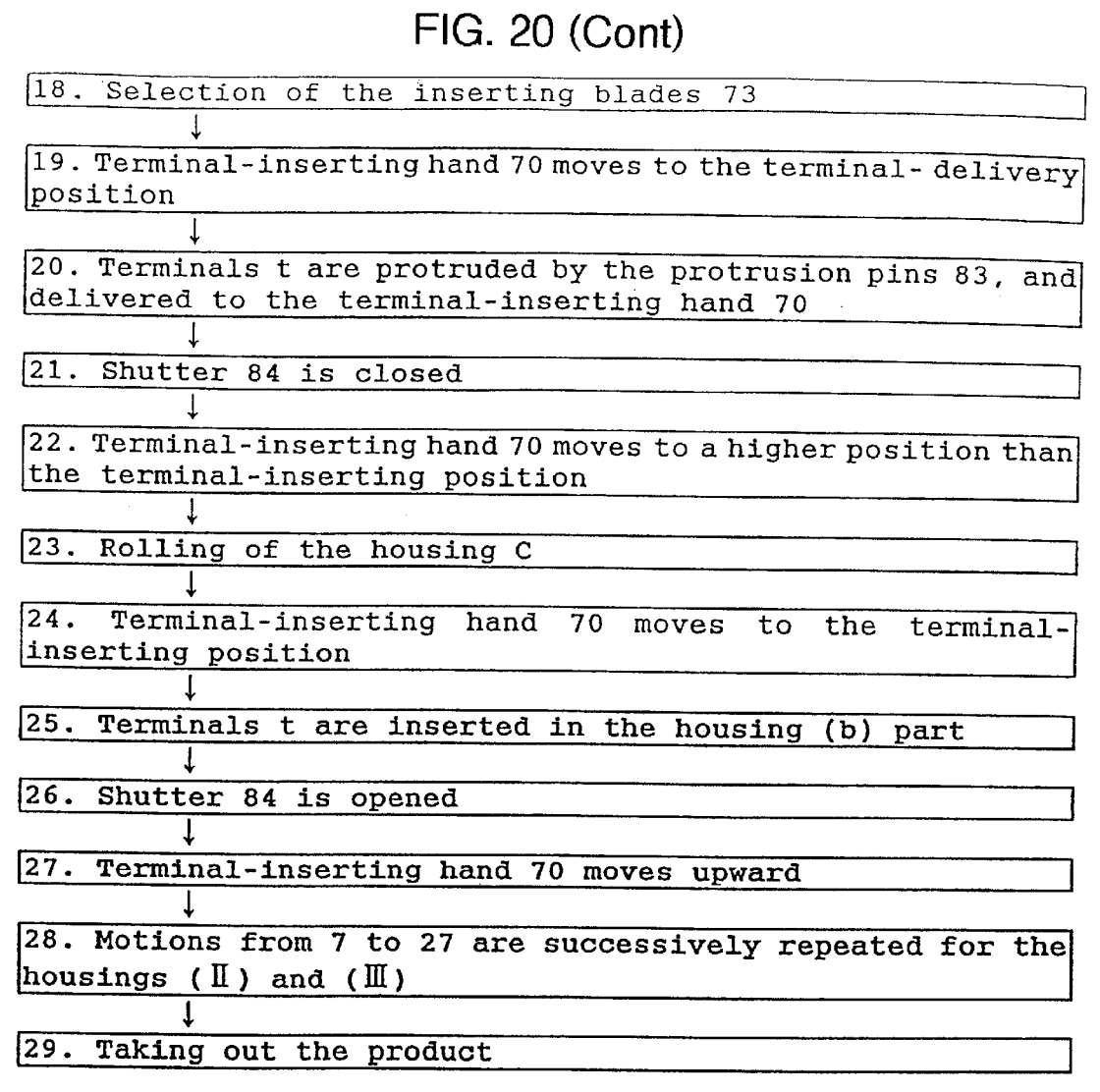

18. Selection of the inserting blades 73

↓

19. Terminal-inserting hand 70 moves to the terminal- delivery position

↓

20. Terminals t are protruded by the protrusion pins 83, and delivered to the terminal-inserting hand 70

↓

21. Shutter 84 is closed

↓

22. Terminal-inserting hand 70 moves to a higher position than the terminal-inserting position

↓

23. Rolling of the housing C

↓

24. Terminal-inserting hand 70 moves to the terminal-inserting position

↓

25. Terminals t are inserted in the housing (b) part

↓

26. Shutter 84 is opened

↓

27. Terminal-inserting hand 70 moves upward

↓

28. Motions from 7 to 27 are successively repeated for the housings (Ⅱ) and (Ⅲ)

↓

29. Taking out the product

FIG. 24(a)
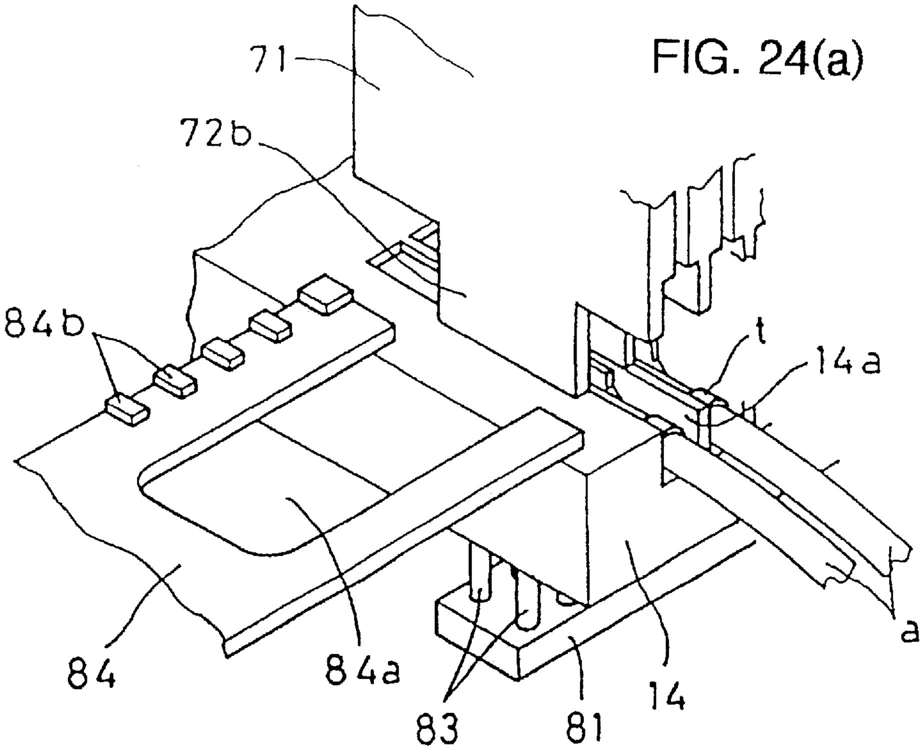
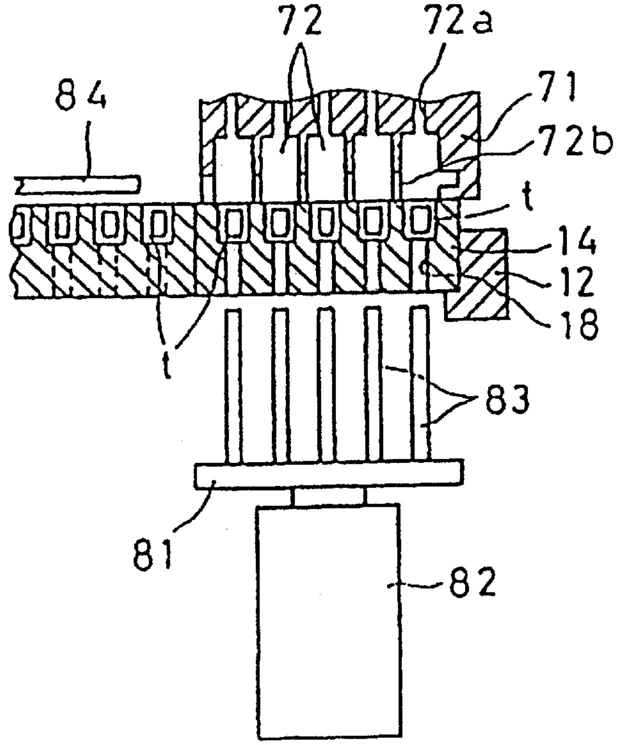
FIG. 24(b)

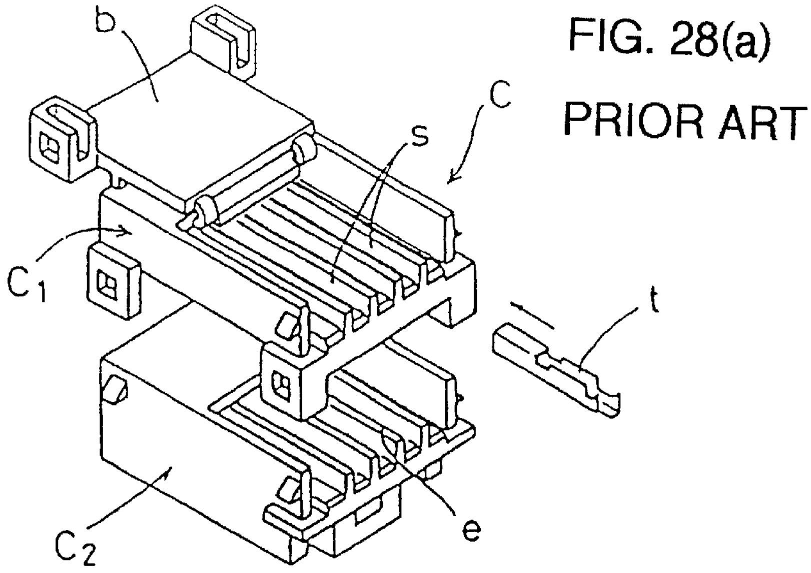
FIG. 28(a)
PRIOR ART
FIG. 28(b)
PRIOR ART
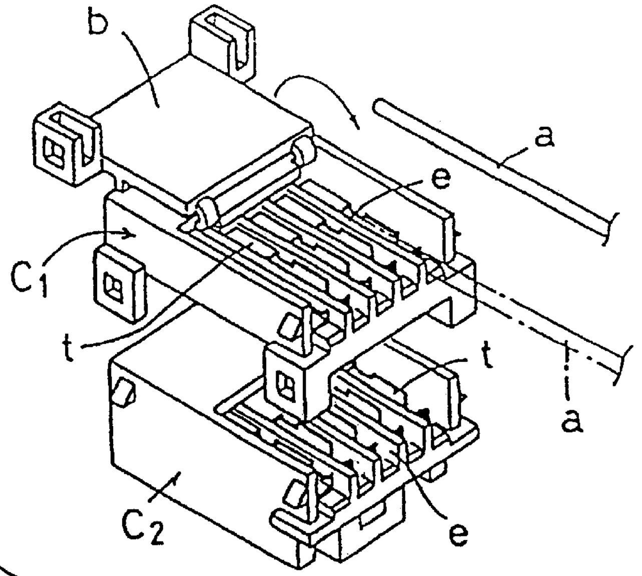
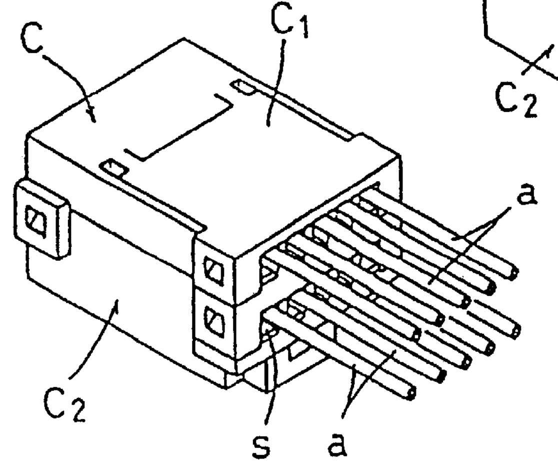
FIG. 28(c)
PRIOR ART

PROCESS FOR MOUNTING TERMINALS WITH ELECTRIC WIRES IN CAVITIES OF CONNECTOR HOUSINGS

BACKGROUND OF THE INVENTION

1. Field of the Invention

The present invention concerns improvements in or relating to mounting terminals with electric wires into connector housings. The invention has particular, but not exclusive application, for connecting terminals with electric wires and then inserting the terminals with electric wires into connector housings from the back.

2. Description of Background Information

Press-connecting and press-clamping are mainly adopted for connecting electric wires with connector terminals in a wire harness and the like.

A press-connecting connection (hereinafter, merely referred to as press-connecting) is shown in FIG. 27. The press-connecting terminals t are loaded in the cavities s of a connector housing C. Press-connecting blade guides 1 are matched with the connector housing C (FIG. 27(*a*)), and electric wires a are supplied (FIG. 27(*b*)), and pressed and connected in the terminals t by press-connecting blades 2 (FIG. 27(*c*)). Namely, the press-connecting presses and loads the electric wires a into a connector housing C from above.

A press-clamping connection (hereinafter, merely referred to as press-clamping) successively press-clamps the connecting pieces of the terminals on the bare conductors after removing the covering of the electric wires. Accordingly, in general, the press-clamping press-clamps the terminals to every electric wire, chucks pick up the terminals one by one with a hand 3 and insert them into the cavities s of the connector housing C from the back (terminal-inserting inlet) as shown in FIG. 29 (refer to Japanese Patent Publication (unexamined) Hei No.9-115642 and the like).

In the above-mentioned press-connecting, for example, in the case of the connector housing C having the cavities s of two stages in a wire harness, the connector housing C is conventionally divided into an upper housing $C_1$ and a lower housing $C_2$ in order to press the electric-wires in from the upper face of each housing $C_1$, $C_2$ as shown in FIG. 28. After the terminals t and the electric wires a are respectively loaded on the upper housing $C_1$ and the lower housing $C_2$ (from FIG. 28(*a*) to FIG. 28(*b*)), cover b is closed and both $C_1$ and $C_2$ are integrally connected together (FIG. 28(*c*)) (refer to Japanese Patent Publication (unexamined) Hei No.10-335037 and the like).

The conventional press-connecting requiring two housings $C_1$ and $C_2$ has further many working steps and it causes an increase in cost. Further, the walls e between the cavities may be bent outwards and the housings swollen by pressing power during press-connecting. As a result, it can happen that the cover b is not successfully closed and the upper housing $C_2$ and the lower housing $C_1$ are not successfully united. Further, from the viewpoint of reducing the bending problems of the cavity walls e, this type of connector C for press-connecting has terminals t in all of the cavities. However, it was found that mounting terminals t in the cavities s to which electric wires a are not press-connected did not avoid the problems. Further, dismantling of both housings $C_1$ and $C_2$ is required for newly press-connecting electric wires a in empty cavities s. As a result the press-connecting is virtually impossible.

In the press clamping on the other hand, the terminals t with the electric wires a are mounted in the cavities s one by one from the back. As a result, only one connector housing C (not divided) is required in place of the two stage type connector C as described above. However it is necessary to connect the electric wires a on the terminals t one by one, and it has a problem in workability. In addition, the connection of the terminals t one by one is apt to cause a chucking miss. Further, since the electric wires a are inserted while being held, the electric wires a are apt to buckle as shown by the chain line of FIG. 29, and such buckling causes a mounting miss.

Further, in the case of the connector housing C having the cavities s of two stages or more, there is a connector housing which mounts the terminals t in the cavities s of the upper and lower stages so that their backs face each other. In this case, after the electric wires a are chucked with the hand 3 as shown in FIG. 30(*a*), the terminals t are inserted in the rotational jig D as shown in FIG. 30(*b*), rolled in the direction of the arrow mark under a condition in which the chucking is released, and chucked again to be inserted in the cavities s as shown in FIG. 30(*c*). The rolling action occasionally results in causing a twisting force on the electric wires a, and there is a risk that the terminals t cannot be straightforwardly re-chucked and a smooth insertion cannot be obtained.

The present invention aims to provide a solution to the problems and disadvantages of the known press-connecting and press-clamping connections described above.

SUMMARY OF THE INVENTION

According to a first aspect of the present invention there is provided a process for mounting press-connecting terminals with electric wires into a connector housing characterized by loading the terminals into a terminal-connecting jig, connecting the electric wires with the terminals, removing terminals with electric wires from the terminal-connecting jig, and inserting the terminals with electric wires from the back into cavities of the connector housing.

By the present invention, a process of connecting the electric wires to the terminals can be achieved which enables the terminals to be inserted and loaded with electric wires in the cavities of the connector housing from the back. As a result, a cost saving can be obtained.

In order to do so, if press-connecting terminals are firstly loaded in the jigs, the electric wires can be loaded from the upper surface of the jig for press-connecting in a manner similar to the conventional process. In this way, the press connecting terminals with electric wires can be obtained by press-connecting without any trouble.

Then, if the press-connecting terminals with electric wires are removed from the press-connecting jigs and loaded in the connector housing, the press-connecting terminals can be inserted in the cavities of the connector housing from the back in like manner to the press-clamping terminals of FIG. 29, and workability is greatly improved.

If press-clamping is carried out in place of press-connecting, for example, if press-clamping terminals are loaded in the jigs and the electric wires, after peeling, are press-clamped on the terminals, the press-clamping terminals can be inserted in the connector housing according to a similar action, and workability is again greatly improved.

Preferably, the steps of loading the terminals into the terminal connecting jig, connecting the electric wires with the terminals, removing the terminals with the wires from the terminal-connecting jig, and inserting the terminals with electric wires from the back into cavities of the connector housing are sequentially carried out automatically.

In the case where the housing has two stages, an upper stage and a lower stage, the housing is preferably rolled (inverted) for inserting the terminals with electric wires from the back into cavities of the upper and lower stages.

Advantageously, the terminals with electric wires are transferred to a terminal-inserting jig from the terminal-connecting jig, and the terminals with electric wires are inserted into the cavities of the connector housing from the terminal-inserting jig.

The terminals with electric wires may be conveniently loaded into cavities in the connecting jig and are preferably prevented from falling out by protrusions on spring plates below the cavities.

Preferably, the terminals with electric wires are transferred from the connecting jig to the inserting jig by pins of a pushing-out jig pushed up through holes below the terminals in the connecting jig.

Advantageously, each terminal with electric wire is transferred by two pins which contact the terminal in a longitudinal direction before and behind the electric wire connecting area.

Preferably, the terminals with electric wires are transferred from the connecting jig to cavities in the inserting jig and are preferably prevented from falling out of the cavities by a shutter. The terminals may be conveniently guided when pushed out of the inserting jig by guides on the shutter and a clearance is preferably provided in the shutter for the pins.

Advantageously, the terminals with electric wires are guided when transferred to the inserting jig by transfer guides on both sides of the cavities.

Preferably, the terminals with electric wires are transferred from the inserting jig to the cavities of the connector housing by members which push out the terminals in a longitudinal direction and support rear end faces of the terminals.

In a preferred embodiment of the present invention, a method of mounting terminals with electric wires into connector housings includes:

(a) providing a connector jig having one or more cavities for receiving a terminal;

(b) inserting at least one terminal in a cavity of the connector jig;

(c) connecting a wire to the at least one terminal located in the cavity;

(d) providing an inserting jig having one or more cavities for receiving a terminal with a wire connected thereto;

(e) relatively moving the connector jig and the inserting jig to position the connector jig below the inserting jig to align the cavity with the terminal and electric wire connected thereto in the connector jig with a cavity in the inserting jig;

(f) transferring the at least one terminal with the wire connected thereto from the connector jig to the inserting jig by applying a force to an underside of the terminal to displace the terminal with the wire connected thereto upwards into the cavity in the inserting jig;

(g) providing a connector housing having one or more cavities for receiving a terminal with a wire connected thereto;

(h) relatively moving the inserting jig and the connector housing to align the cavity with the terminal and wire connected thereto in the inserting jig with a cavity in the connector housing; and (I) transferring the at least one terminal with the wire connected thereto from the cavity in the inserting jig to the connector housing.

According to a second aspect of the present invention there is provided a system for mounting press-connecting terminals with electric wires in a connector housing characterized by a mounting machine for mounting the terminals on a connecting jig, electric wire-measuring and wire-connecting machines for connecting wires to the terminals, and a terminal-mounting machine for removing the terminals with electric wires from the press-connecting jig and inserting the terminals with electric wires from the back into cavities of the connector housing. Preferably, the machines are sequentially installed along guide rails.

Advantageously, an inserting jig is provided to receive the terminals with electric wires from the connecting jig and insert the terminals with electric wires into the cavities in the connector housing. Preferably, a mechanism is provided for inserting the terminals with electric wires into the cavities of the connector housing by pushing out the terminals.

In one arrangement, the mechanism has a plurality of blades movable in an inserting direction for inserting respective terminals with electric wires into the cavities of the connector housing. The blades may be independently movable. Alternatively, a selection mechanism may be provided for moving selected blades as a unit.

Advantageously, a roll over mechanism is provided for supporting the connector housing in either one of two positions to present selected cavities for inserting the terminals with electric wires. For example, the connector housing preferably has upper and lower stages and the roll over mechanism includes a frame for mounting the connector housing and means for rotating the frame through 180° to roll over (invert) the connector housing whereby the connector housing is supported in a first position to present the cavities of the upper stage for inserting the terminals and is rolled over and supported in a second position to present the cavities of the lower stage for inserting the terminal.

Preferably, the connecting jig has cavities for mounting the terminals arranged in parallel on an upper face and provided with penetration holes for pushing-up pins which contact a lower face of the terminals and strip off the terminals so that the terminals on which the electric wires are connected are capable of being stripped off upwards from the cavities.

Advantageously, the terminals are loaded from the front of the cavities in the connecting jig, contacted with the back of the cavities, and hooked on protrusions of spring plates arranged under the cavities to prevent the terminals falling out. In this way, the terminals are stabilized in the cavities and the action of attaching the wires such as the press-connecting or the like is stabilized.

More particularly, after the terminals are loaded in the respective cavities of the connecting jig, the electric wires are press-connected or press-clamped on the respective terminals from above, the pushing-up pins are raised through the penetration holes from below, and the terminals with electric wires attached are ejected from the cavities. Accordingly, the terminals are received and mounted in the connector housing. At this time, if the receiving of the terminals can be unified, a unified mounting can be carried out.

When the above-mentioned terminals are press-connecting terminals, the electric wires can be loaded from the top of the connecting jigs in like manner as a conventional process. The press-connecting terminals with electric wires can be obtained by press-connecting without any trouble if the press connecting terminals are loaded in the connecting jigs and the electric wires are press connected on the press-connecting terminals. In this case, it is designed to remove the terminals with electric wires from the connecting jigs and load them in the connector housings. Thus, the press-connecting terminals can be inserted in the cavities of the connector housings from the back in like manner as the press-clamping terminals of FIG. 29, and workability is greatly improved. The press clamping can be also carried out on the retaining jigs. Preferably, a mechanism is provided for transferring the terminals with electric wires from the cavities of the connector jig into the cavities of the inserting jig by pushing out the terminals.

In one arrangement, the connecting jigs can be provided with pushing-up pins. Thus, the pushing-up pins may be arranged under a condition capable of protrusion through respective penetration holes in a lower face of the cavities. For example, the pushing-up pins may be provided on a pushing-up plate freely movable on the base of the connecting jig with the pushing-up plate pushed up and elevated from the underside of the base by an actuator. Thus, when the arrangement of cavities in the connector housing is changed and the connector jigs only need to be changed to correspond to the change. Namely, the actuator to carry out the pushing-up action can be used in common with the connecting jigs of different modes.

Preferably, springs are arranged on the base of the connecting jigs for moving the pushing-up plate in the return direction in which the pushing-up pins retreat from the cavities. As a result, the return action such as by self-weight of the pushing-up plates or the like, or the return action by the actuator or the like becomes unnecessary. In this way, the return action becomes positive and the cost can be reduced.

Advantageously, two penetration holes are arranged in correspondence with the longitudinal direction of the terminals received in the cavities of the connector jig, and the pushing-up pins are arranged in correspondence with the penetration holes. As a result, the pushing-up pins are pushed up in the longitudinal direction of the terminals before and after the electric-wire connecting part of the terminals. In this way, the pushing-up action becomes stable because the pushing-up pins provide two contact points.

More particularly, the two contact points support the load caused by the self-weight of electric-wires and, because the two points are before and after the connecting parts, the load caused by the self-weight of electric wires is steadily supported. Accordingly, the pushing-up action becomes more stable.

In another preferred embodiment of the present invention there is provided an apparatus for mounting terminals with connector wires into connector housings including:

(a) a connector jig having an upper surface;

(b) at least one cavity in the upper surface for receiving a terminal;

(c) at least one hole penetrating the cavity from below;

(d) pin mechanism for insertion in the at least one hole for displacing the terminal in an upwards direction;

(e) mechanism for connecting a wire to the terminal in the connector jig cavity;

(f) an inserting jig having a lower surface;

(g) at least one cavity in the lower surface for receiving a terminal;

(h) mechanism for aligning the at least one cavity in the upper surface of the connector jig with the at least one cavity in the lower surface of the inserting jig whereby the terminal with the wire connected thereto can be transferred from the connector jig to the inserting jig by actuation of the pin mechanism;

(I) a connector housing having a rear surface;

(j) at least one cavity in the rear surface for receiving a terminal;

(k) mechanism for aligning the at least one cavity in the lower surface of the inserting jig with the at least one cavity in the connector housing; and (l) mechanism for transferring the terminal with the wire connected thereto from the inserting jig to the connector housing.

Preferably, the connector jig has a plurality of cavities in the upper surface, the inserting jig has a plurality of cavities in the lower surface, and the connector housing has a plurality of cavities in the rear surface whereby one or more terminals with wires attached thereto can be transferred from the connector jig to the connector housing via the inserting jig.

Advantageously, a plurality of connector housings are provided and the inserting jig is operable to transfer terminals with wires connected thereto from the connector jig to the connector housings in a pre-determined manner.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIG. 9 is a detailed perspective view of part of the terminal mounting part shown in FIG. 3;

FIG. 10 is a schematic view of the terminal-mounting action of the apparatus;

FIGS. 17(*a*) and (*b*) show schematically the terminal-mounting action to the connector housing;

FIG. 20 is a flow chart of the operation of the apparatus;

FIGS. 24(*a*) and 24(*b*) show the delivery action from the connecting jig to an alternative inserting jig;

FIGS. 28(*a*), 28(*b*) and 28(*c*) show another press-connecting action according to the prior art;

DETAILED DESCRIPTION OF THE PREFERRED EMBODIMENTS

Figure 1:
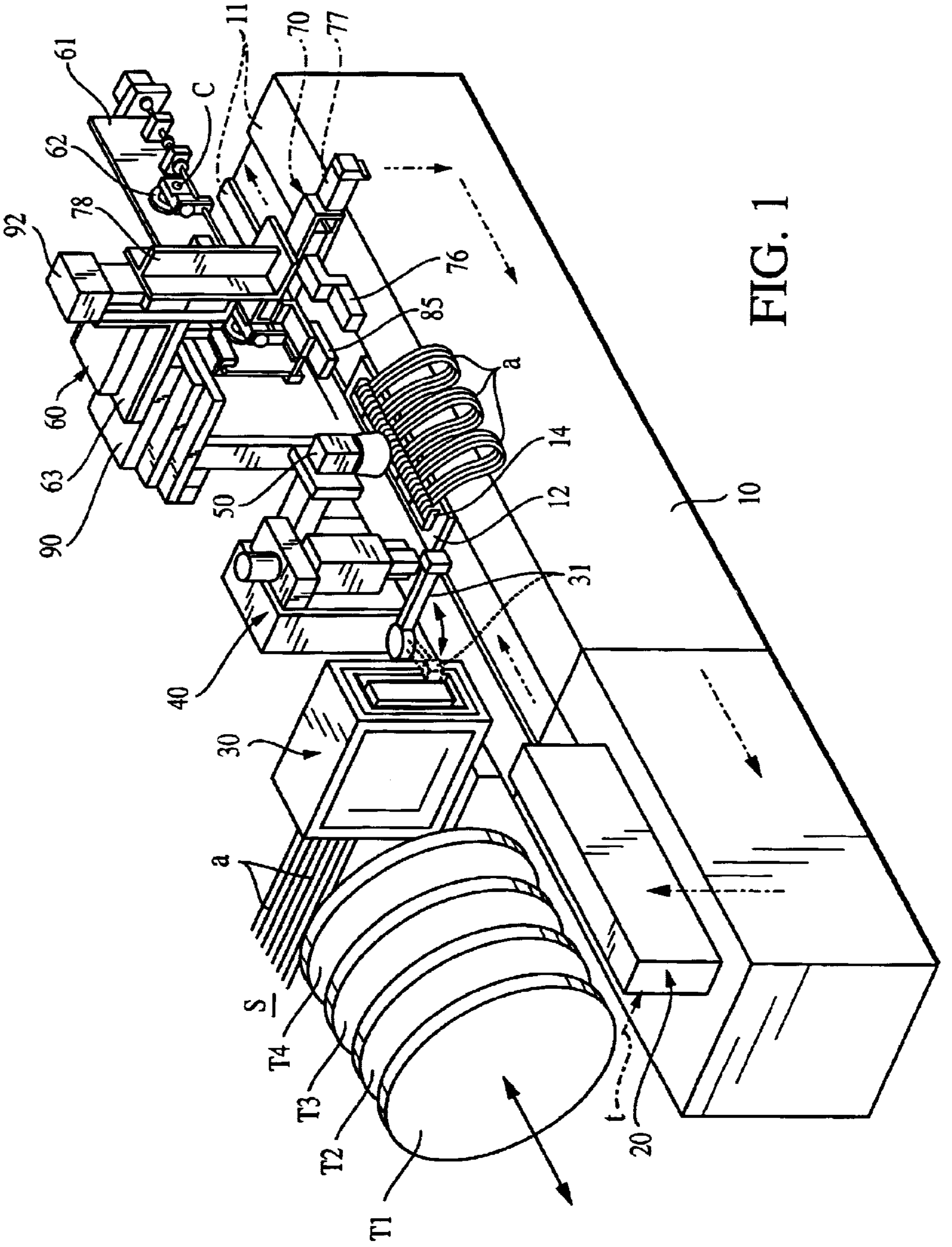
FIG. 1 is a schematic perspective view of an apparatus embodying the present invention.

One example of apparatus for producing wire harnesses in which terminals with electric wires are mounted in a connector housing according to the present invention is illustrated in FIG. 1.

The apparatus has guide rails 11 equipped on a base stand 10. A mounting machine 20 for terminals t, a measuring machine 30 for electric wires a, a press-connecting machine 40, an inspection device 50 and a terminal-mounting machine 60 are arranged along the guide rails 11.

As disclosed in, for example, Japanese Patent Publication (unexamined) Hei No.10-241473, and Japanese Patent Applications Hei No.10-337249 and No. 10-350013, the respective disclosures of which are herein expressly incorporated by reference in their entireties, a jig pallet 12 is moved from left to right by a conveyor as shown by the chain line arrow mark on the afore-mentioned guide rail 11. The jig pallet 12 descends downward by an elevator arm (not illustrated) when the pallet reaches the right end, is similarly moved to the left end by the conveyor, and is similarly positioned at the left end of the guide rail 11 by the elevator arm. Namely, the jig pallet 12 circulates the route (chain line arrow mark), and carries out the loading of the terminals t, the press-connecting of the wires a, and the delivery of the terminal.

Figure 7:
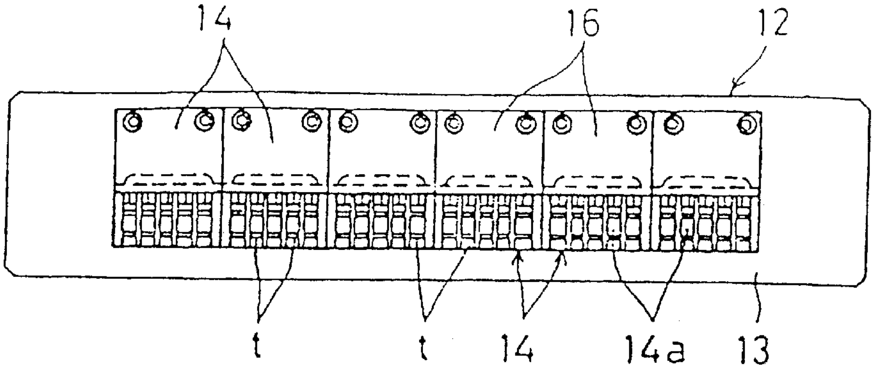
FIG. 7 is a plan view of a jig pallet.
Figure 21:
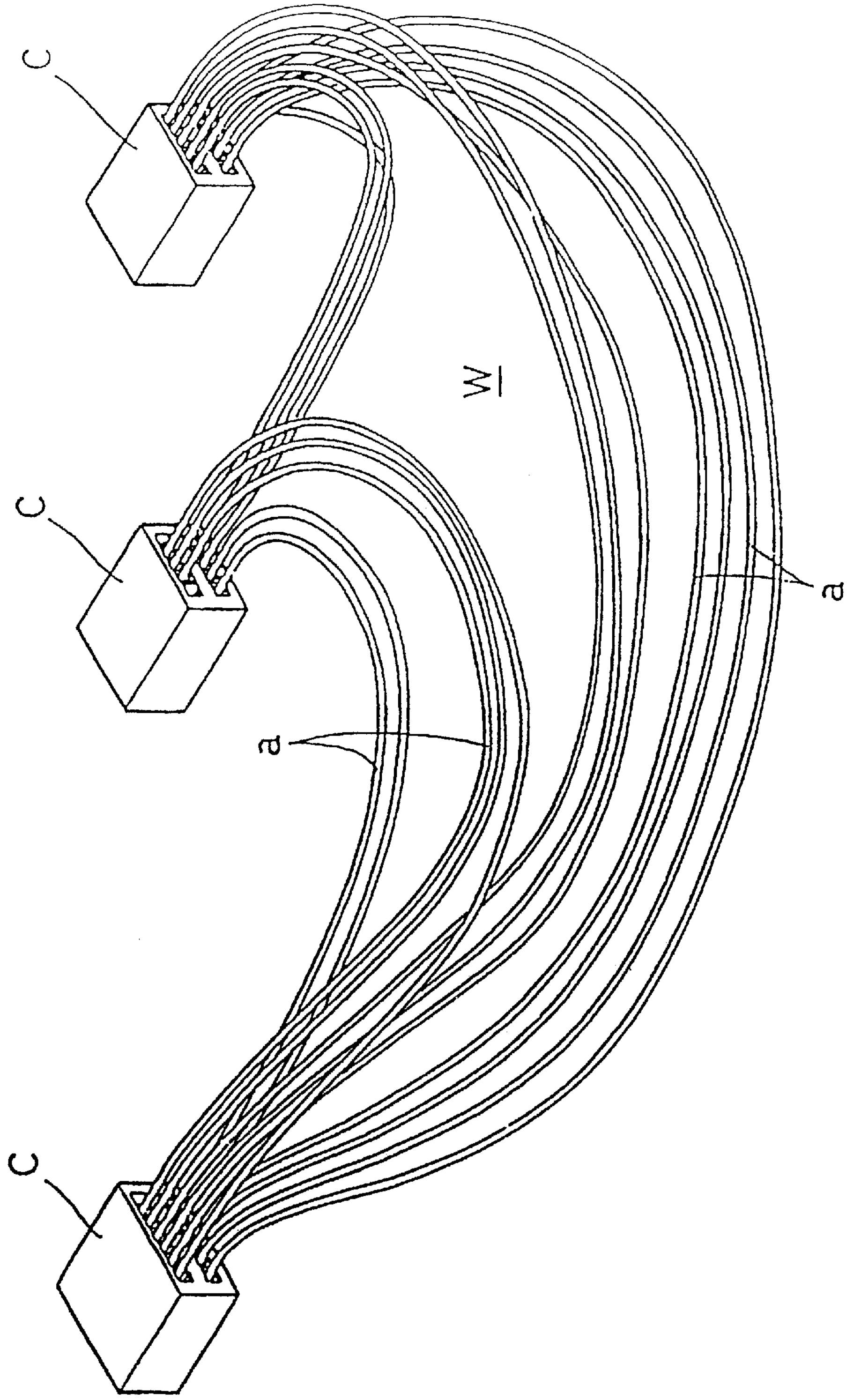
FIG. 21 is an example drawing of a wire harness manufactured by the apparatus.

The jig pallet 12 is a pallet in which six press-connecting jigs (blocks) 14 with cavities 14*a* supporting the terminals t are arranged in parallel on a base 13 as shown in FIG. 7. The numbers of the jigs 14 and the cavities 14*a* are arbitrary, and they are generally determined by the number of connector housings mounting the press-connecting terminals t by one jig pallet 12 and the number of the cavities 14*a*. For example, this example is a case of producing the wire harnesses W wiring electric wires a as shown in FIG. 21 and the like. The number of connector housings C is three, and the cavities of the connector housings have upper and lower stages with five cavities in each stage. Therefore, as described later, the group number of the press-connecting terminals mounted from the one jig pallet 12 is 3×2=6, and since the number of terminals in the group is five, the jigs 14 are six, and the cavities 14*a* are five. For example, all of the jigs 14 can be constituted in a body.

Figure 8A:
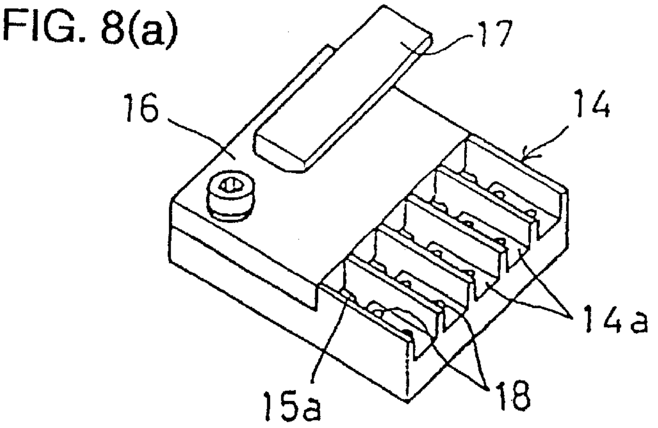
FIGS. 8(*a*) and 8(*b*) are perspective and cross-sectional views, respectively, of the terminal press-connecting jig.
Figure 8B:
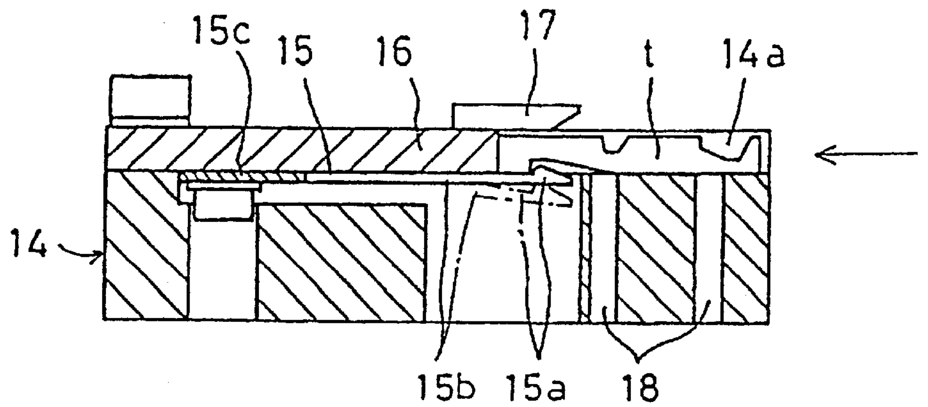

In the jigs 14, as shown in FIG. 8(*b*), strip spring pieces 15*b* of spring blades 15 are arranged in the respective cavities 14 under plate 16 to which the base parts 15*c* of the respective spring blades 15 are fixed to the lower face with screws unifying the respective spring pieces 15*b*.

When the terminals t are inserted in the cavities 14*a* from the arrow mark direction, the terminals t are positioned by plates 16, and protrusions 15*a* of the spring plates 15 are deflected as shown by the chain line and hook on the terminals t to prevent extraction of the terminals t. The terminals can also be mounted from above.

The floating-up of terminals t is prevented by providing stiffening plates 17 on the plates 16. The stiffening plates 17 are installed on the base 13 and are designed to be removed during the transfer of terminals t described later (during pushing up). The plates 17 are usually biased downward by springs and can be moved upward against the resistance of the springs to allow upward movement of terminals t. Two penetration holes 18 pass through the respective cavities 14*a* from the lower face of the jigs 14.

The terminal-mounting machine 20 mounts the terminals t in the respective cavities 14*a* of the above-mentioned jigs 14 by selectively cutting the various terminals t one by one from the terminal belt of terminal reels $T_1$–$T_4$, as described in, for example, Japanese Patent Publication (unexamined) Hei No.10-208844, the disclosure of which is herein expressly incorporated by reference in its entirety. At this time, the mounting of the terminals t on the connector housing C is carried out by a unit of one jig 14, therefore the terminal t corresponding to the inserted terminal sequence is mounted on the respective jigs 14 in the sequence. Accordingly, there is a case of having empty cavities 14*a* on the way. The terminal reels $T_1$–$T_4$ properly move in the direction of the arrow mark (FIG. 1), and correspond to the position accepting the terminal belt of the terminal-mounting machine 20.

The electric wire-measuring machine 30 selects and sends the required electric wires a from a plurality of supplies S, measures the requisite length of a plurality of wires a at one time or one by one, and chucks the end of the wire with hand 31 to transfer the wire to the press-connecting machine 40 of the next stage, as disclosed in Japanese Patent Publication (unexamined) Hei No.10-154423, and Japanese Patent Applications Hei No.10-349947, No.10-337042, the respective disclosures of which are herein expressly incorporated by reference in their entireties, and the above-mentioned Japanese Patent Application Hei No.10-337249.

The hand 31 goes back and forth in the direction of the arrow mark (FIG. 1) between the electric wire exit of the measuring machine 30 and the position of the press-connecting machine 40. The hand 31 may include one arm (refer to Japanese Patent Applications Hei No.10-337042 and No.10-337249). Alternatively, hands including two arms alternately delivering both hands to the measuring machine 30 and the press-connecting machine 40 to transfer the wires may be provided (refer to Japanese Patent Application Hei No.10-349947).

The press connecting machine 40 press-connects the electric wires a one by one, or selectively press-connects a plurality of wires, transferred by the hand 31, in the requisite terminals tin the jig 14, as disclosed in Japanese Patent Publications (unexamined) Hei No.10-241473, No.10-106370, No.10-106371, the latter two disclosures of which are herein expressly incorporated by reference in their entireties, and the above-mentioned respective applications which are not yet opened. At this time, the jig pallet 12 moves left and right, the terminal t at the requisite position is positioned at the press-connecting position, and the press-connecting is carried out.

Figure 18A:
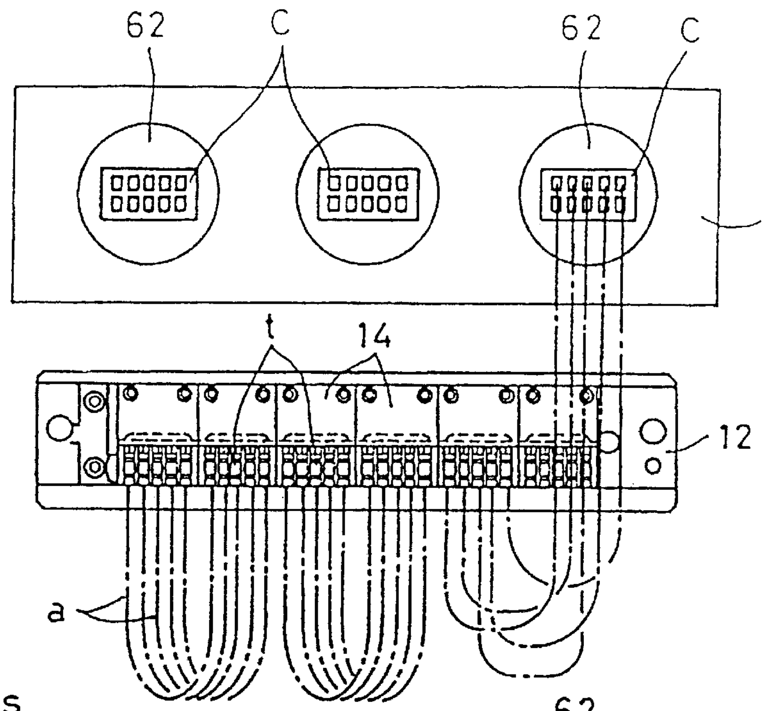
FIGS. 18(*a*), 18(*b*) and 18(*c*) show the terminal-mounting in more detail.
Figure 18B:
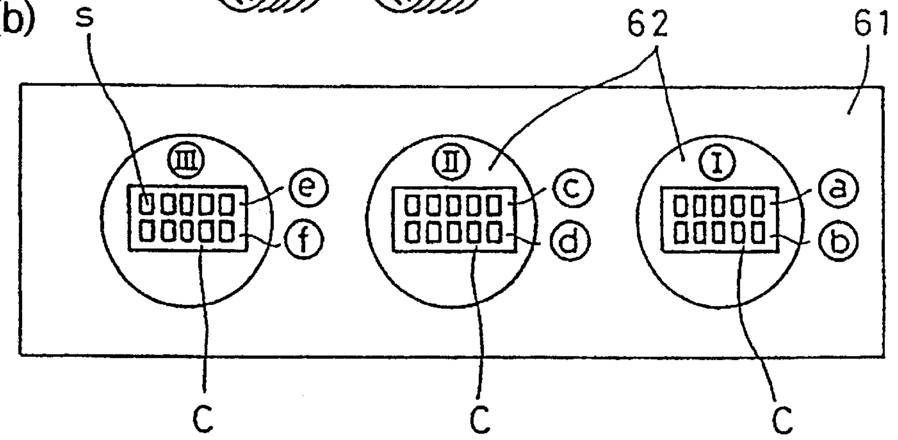
Figure 18C:
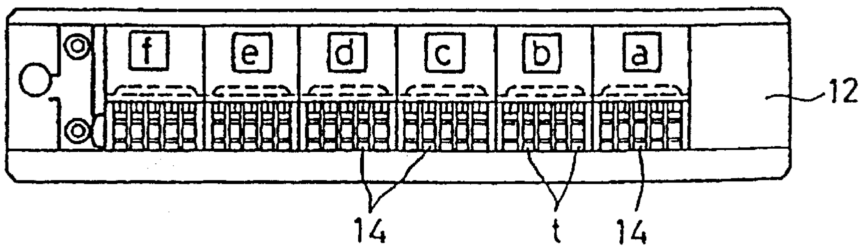

Accordingly, the press-connecting of various kinds of wiring arrangements can be carried out on the jig pallet 12, as disclosed in Japanese Patent Publication (unexamined) Hei No.10-241473. For example, as shown in FIG. 1 and FIG. 18, the jigs 14 are paired one after another in the direction of travel and the electric wires are only wired to the mutual pairs.

Figure 19:
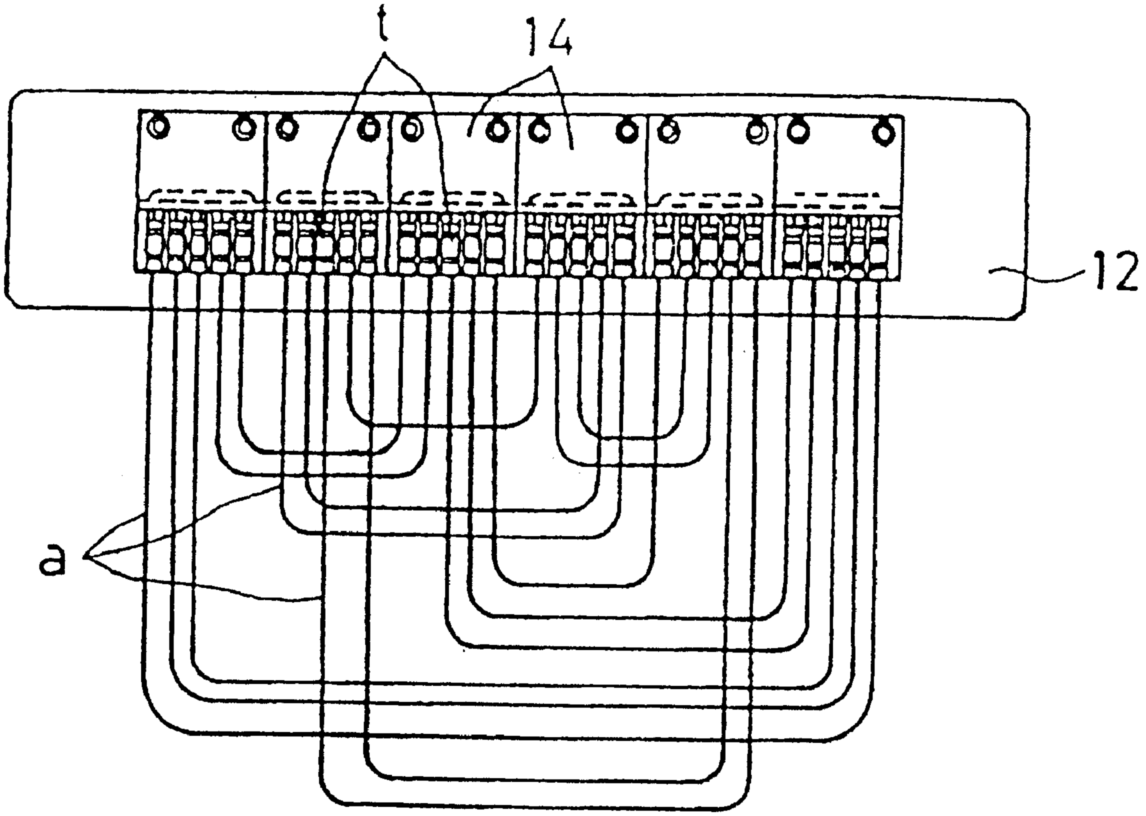
FIG. 19 shows an alternative terminal-mounting.

Alternatively, as shown in FIG. 19, various kinds of wiring arrangements such as an arrangement of arbitrarily wiring the electric wires between the respective jigs 14 can be carried out. The mode of wiring in FIG. 19 becomes the wire harness W shown in FIG. 21 in which the electric wires are crossed. Therefore, the electric wires are wired on the respective jigs 14 in accordance with the wiring arrangements of wire harness W.

Further, when the jigs 14 are made of a hard metal such as steel or the like, the walls between the cavities 14*a* are not bent by the pressing power of the press-connecting on the jigs 14. Accordingly, in case of jigs 14 made of a hard metal, there is no problem for inserting the terminals in the subsequent processes or the like, even if empty cavities without terminals are provided.

Further, when the shapes of the cavities are the same, the press-connecting on the jigs 14 is carried out by the same jigs 14 irrespective of the shapes of connector housings. For example, the electric wire-measuring and press-connecting can be carried out by a robot uniting the electric wire-measuring machine 30 and the press-connecting machine 40 described in the fore-mentioned Japanese Patent Publication (unexamined) Hei No. 10-106370.

The inspection device 50 is a machine which picks up a condition of press-connecting the electric wires into the respective terminals t by a CCD camera and judges whether the press-connecting is proper or not based on the images. For example, the machine judges the normal press-connecting condition in comparison with an abnormal condition. The judgement may be carried out by a person or automatically.

As shown in FIG. 10, the terminal-mounting machine 60 is a machine in which the jig pallet 12 with terminals in which the electric wires a are press-connected moves as the arrow mark. When the pallet 12 comes to the terminal-inserting position 0, the terminals t are taken out from the respective jigs 14, and the terminals t are mounted in the housings C on the connector housing retaining plates (pallet) 61 which move left and right. The details are shown in FIG. 1–FIG. 6.

Figure 11:
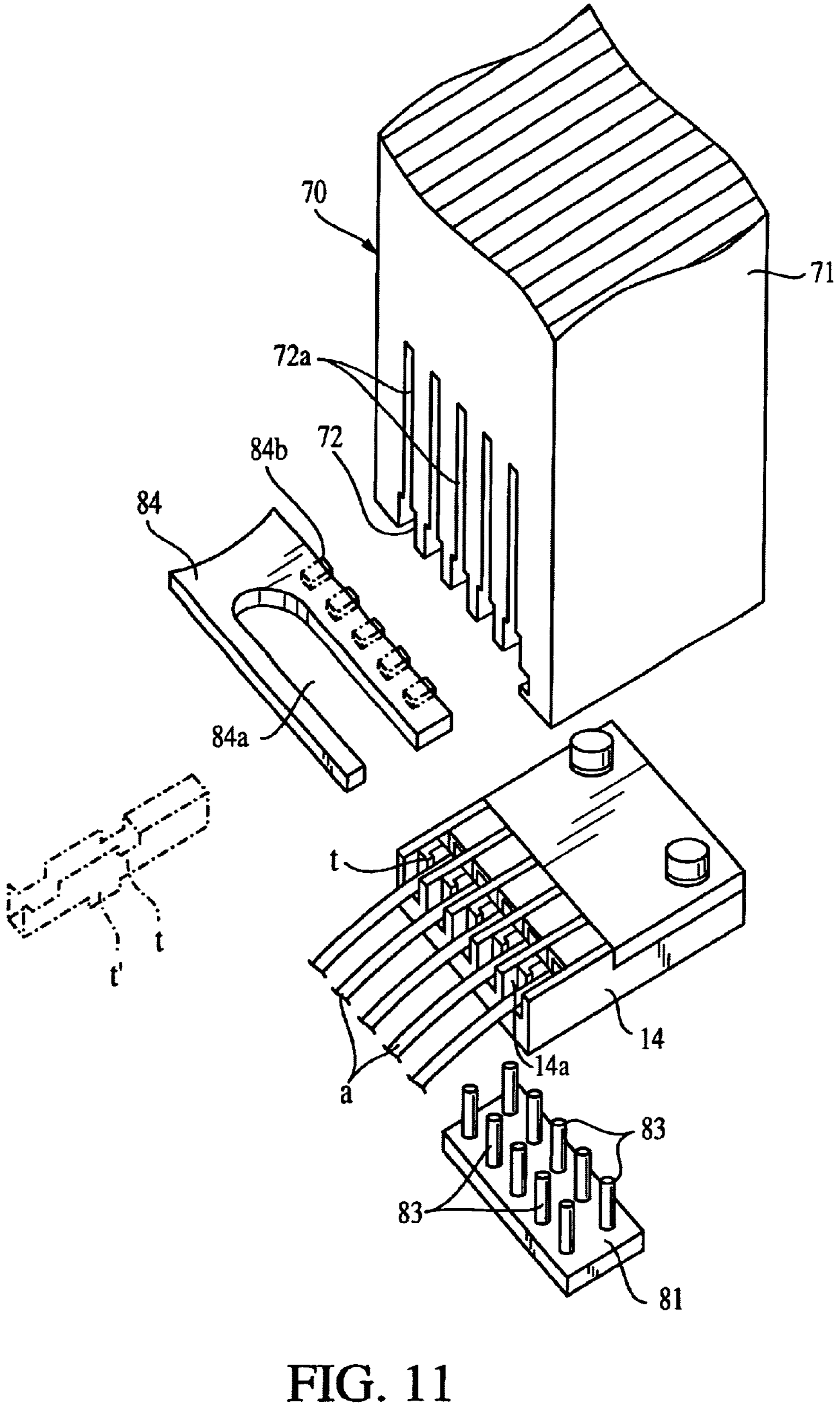
FIG. 11 is an exploded perspective view of the delivery action from the press-connecting jig to the inserting jig.

Namely, an air cylinder 82 elevating a terminal-protruding jig 81 (FIGS. 2 and 10) is arranged in the base stand 10 under the terminal-inserting position O. A hand 70 having a terminal inserting jig 71 is arranged above while keeping free elevation. The terminal-inserting jig 71 and the terminal-protruding jig 81 have the numbers of the terminals t which the I jig 14 can hold, the terminal-inserting jig 71 and pins 83 corresponding with the I jig 14 on the pallet 12. Terminal-inserting jig 71 has cavities 72 (FIG. 11) for the terminals t and grooves 72*a* in which blades 73 (described later) are to be inserted extend upward from the cavities 72 (refer to FIG. 11). Further, a shutter 84 installed on the hand 70 is capable of passing under terminal inserting jig 71, and the pins 83 pass through holes 84*a* of the shutter 84.

Figure 12A:
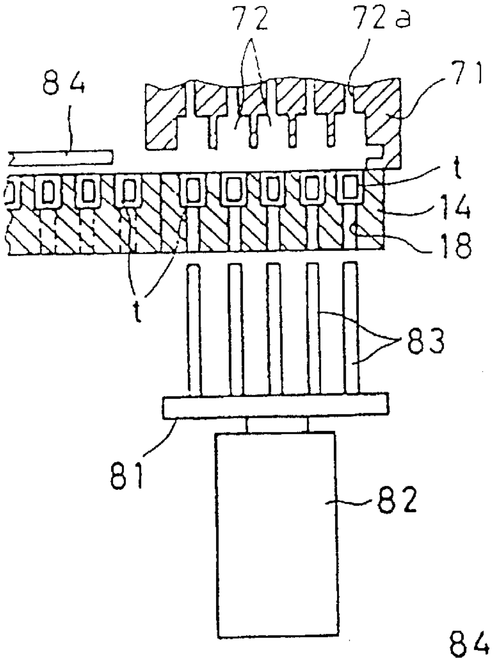
FIGS. 12(*a*), 12(*b*) and 12(*c*) show the delivery action from the press-connecting jig to the inserting jig.
Figure 12B:
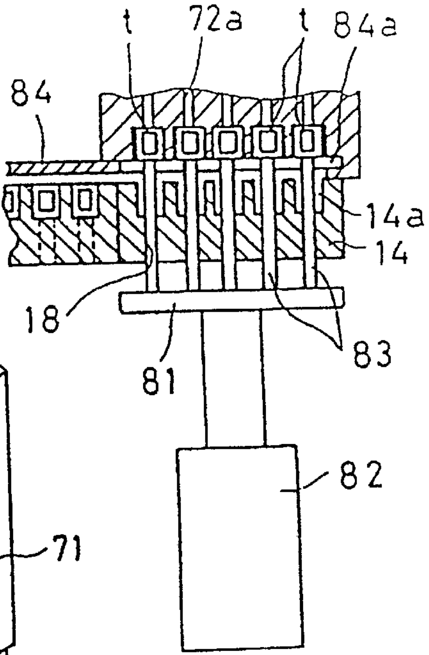
Figure 12C:
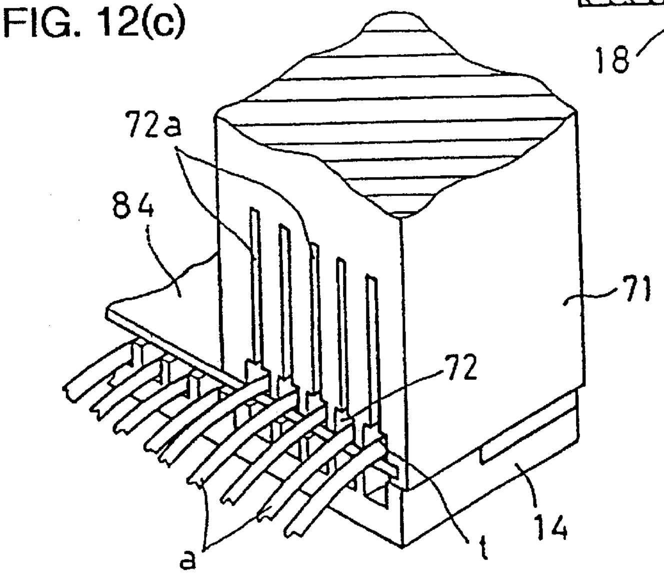
Figure 14:
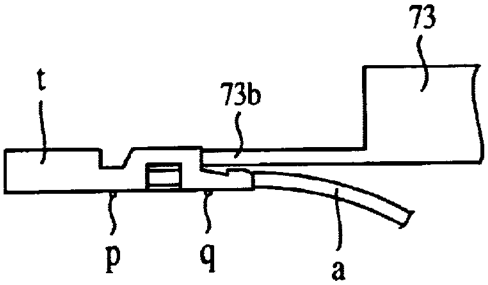
FIG. 14 shows a further detail of the terminal-inserting action.

Accordingly, as shown in FIG. 12(*a*), when the terminal-protruding jig 81 is elevated against the jigs 14 at the inserting position, the respective pins 83 protrude through the penetration holes 18 of the jigs 14 and transfer the terminals t in the cavities 14*a* to the inserting jig 71 as shown in FIG. 12(*b*) and FIG. 12(*c*). At the protrusion, the pins 83 contact the press-connecting member of the terminals t fore and aft in the longitudinal direction at two points p and q (FIG. 14) and protrude the terminals t.

Figure 5:
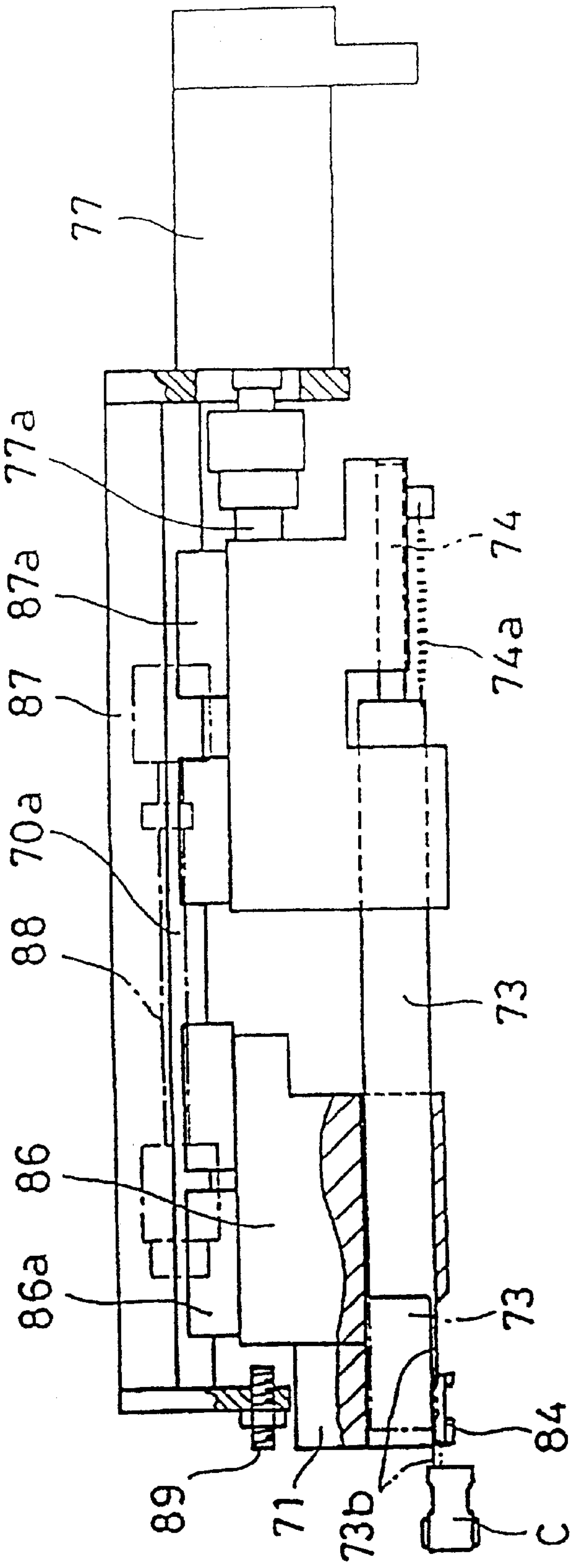
FIG. 5 is a front view partially in cross-section, of the hand part shown in FIGS. 2 and 4.
Figure 13A:
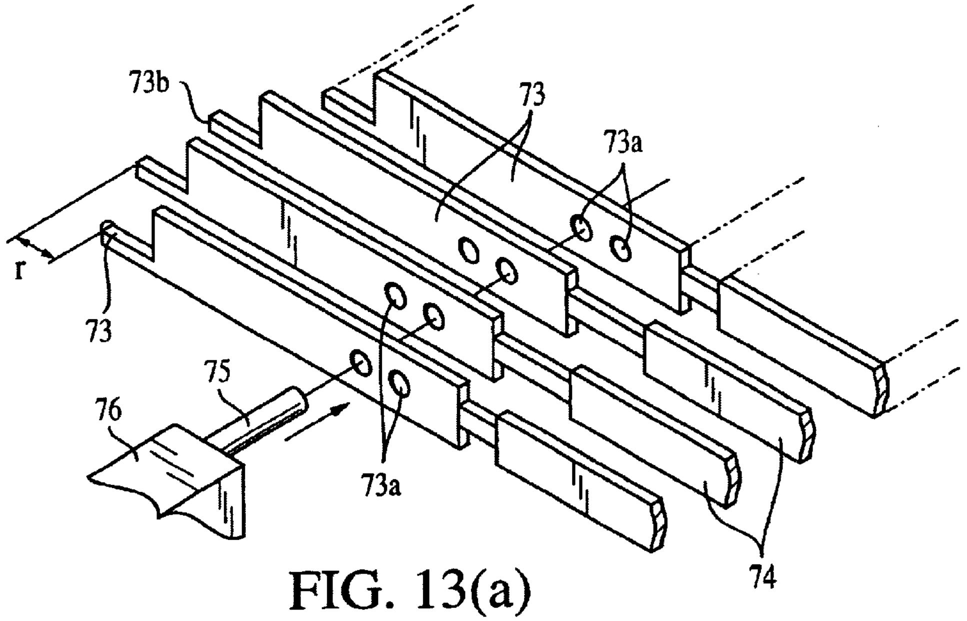
FIGS. 13(*a*) and 13(*b*) show the terminal-inserting action.
Figure 13B:
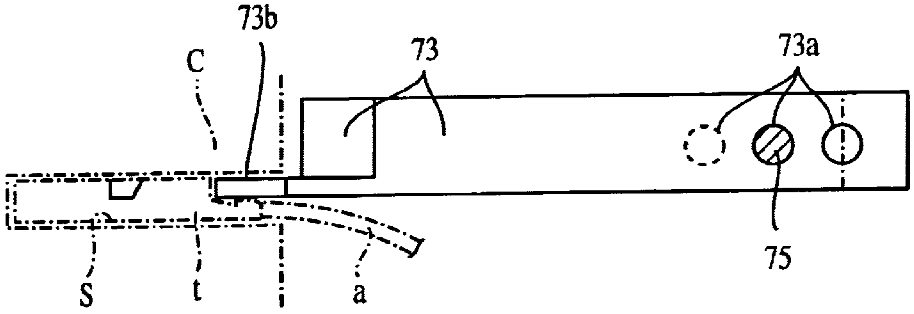

Further, as shown in FIG. 5 and FIG. 13, selected blades 73 (described later) preliminary proceed against other blades 73 and ends 73*b* contact end faces of the terminals t to which the electric wires a are connected. Therefore, even though the terminals are being pulled backward by the weight of the electric wires a, the terminals t are transferred (received) within the jigs 71 without being inclined.

The delivery is carried out at the cavities 14*a* and 72 between the jigs 14 and 71. Therefore, the pick-up miss (delivery miss) decreases remarkably, and the terminal insertion miss of subsequent processes decreases remarkably. It is preferable to carry out the protrusion at two points p and q (FIG. 14) with two pins 83, but one pin may be sufficient, or three or more may be used. In either case, the terminals t protrude the position to be transferred without being inclined.

Figure 2:
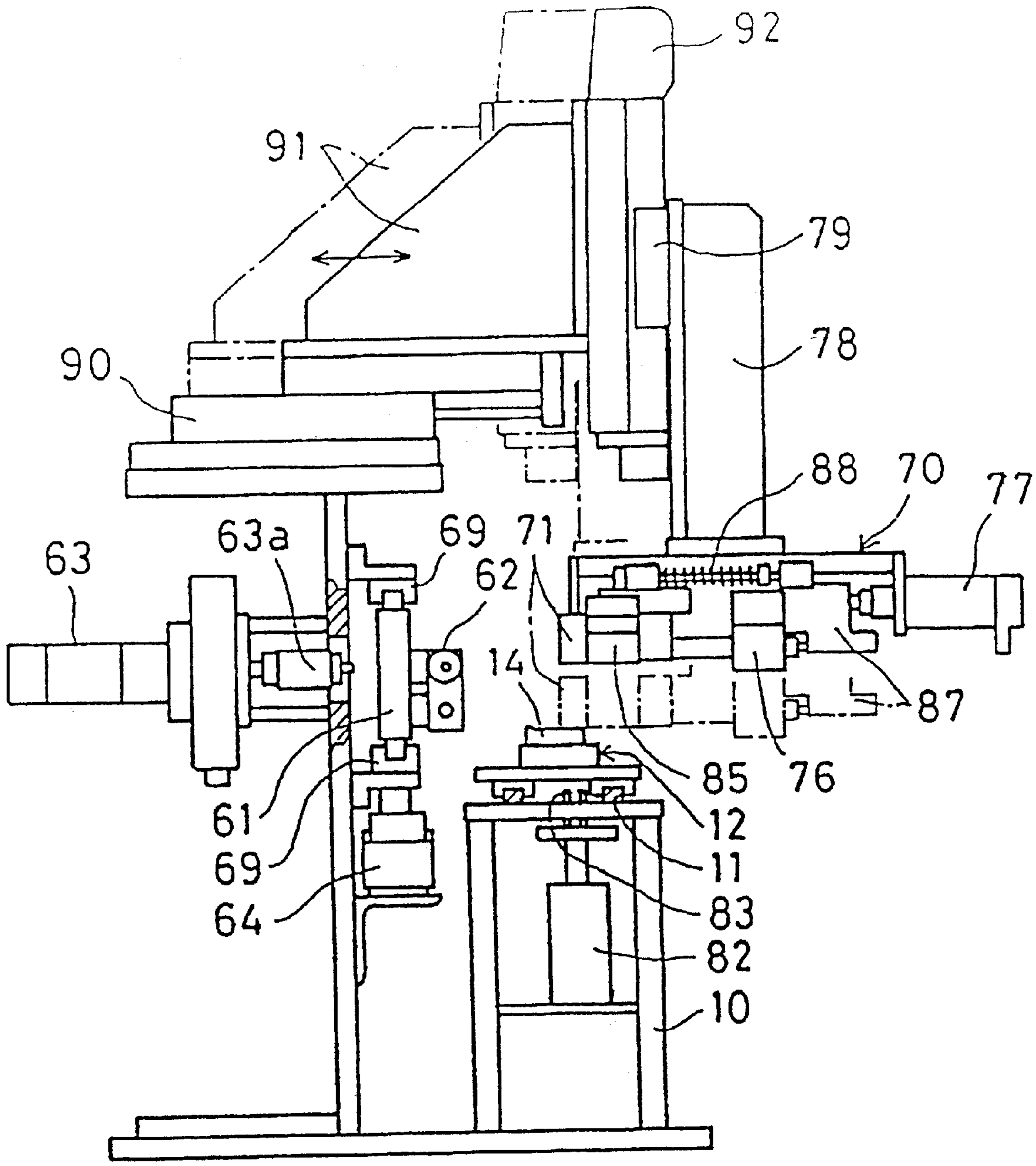
FIG. 2 is a left side view partially in cross-section of the terminal-mounting part of the apparatus shown in FIG. 1.

As shown in FIG. 2, the hand 70 is supported under free elevation on upper frame 91 of slide cylinder 90 on the base stand 10 through supporting plate 78 and slider 79, and transfers back and forth at the waiting position and the mounting position by the movement of the frame 91 in the direction of the arrow mark by the slide cylinder 90. The elevation of the supporting plate 78 is carried out by the actuator 92 provided on the frame 91, and the supporting plate 78 elevates to three positions such as the waiting position at the highest position, the inserting position at the lowest position and the mounting position at the middle position.

The above-mentioned terminal-inserting jig 71 is arranged on the lower face of the edge of the hand 70, and the above-mentioned shutter 84 is arranged adjacent. A cylinder 85 advances and retreats the shutter 84 and, when delivery from the above-mentioned jig 14 to the inserting jig 71 finishes, the shutter 84 is sent to the lower face of the jig 71 by the cylinder 85 and falling of the terminals t from the jig cavities 72 is prevented by providing the shutter 84 at the front and back of the lower face of the terminals t during the elevation of the hand 70.

Further, gaps required for delivering the shutter 84 between the jigs 14 and 71 may be formed during the above-mentioned descent of the hand 70 but, after the protrusion of the terminals by the pins 83, the gaps may be formed together with the pins 83, or by elevation by the gaps of grooves of the hand 70. For example, when the jigs 14 and 71 approach closer, or preferably contact with each other, the delivery becomes more positive.

Figure 6:
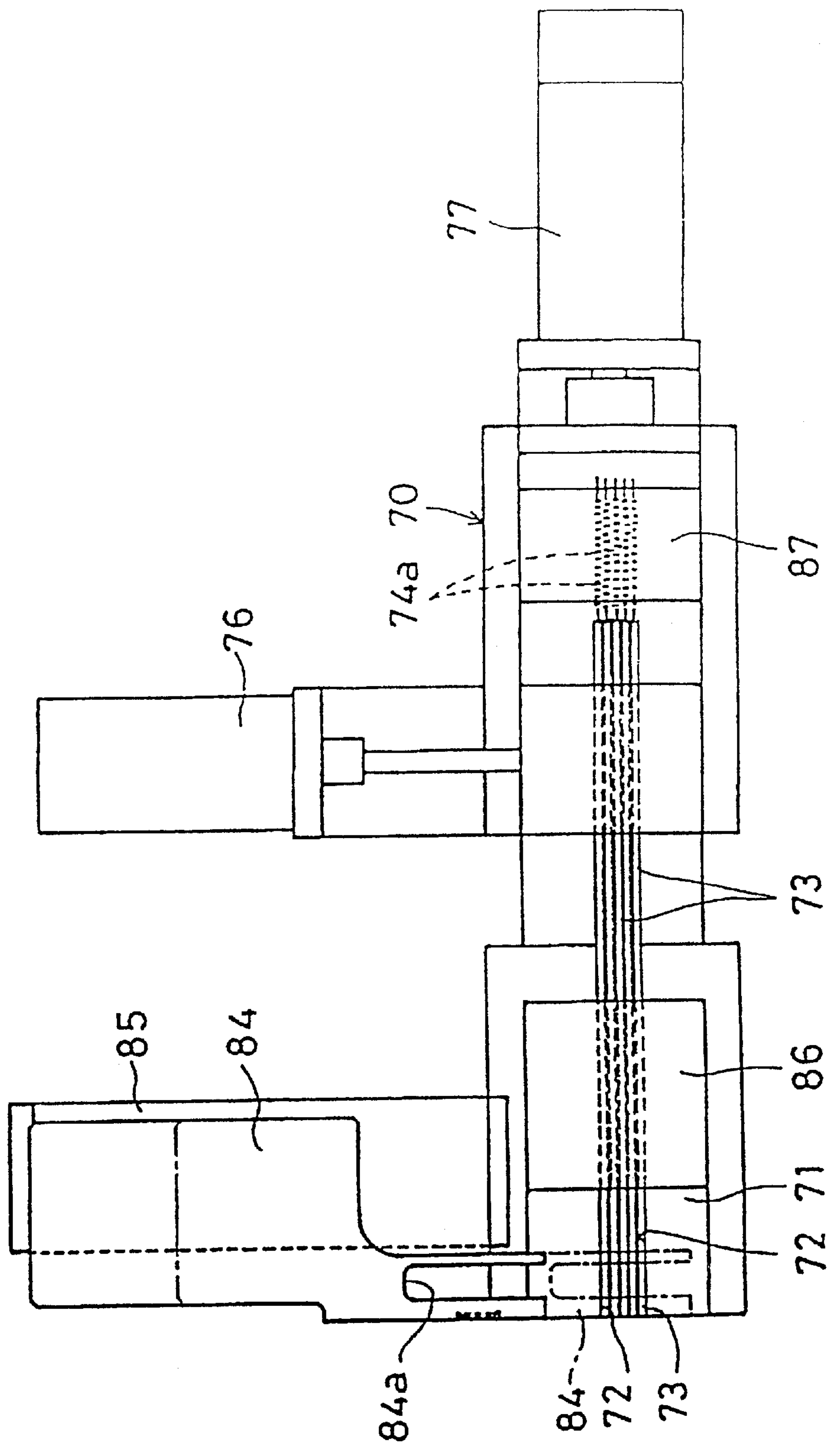
FIG. 6 is a bottom view of the hand part shown in FIGS. 2 to 5.

As shown in FIG. 6 and FIG. 13(*a*), the requisite number (five in the present mode of operation) of the insertion blades 73 are arranged in parallel on the insertion hand 70. Air cylinders 74 are respectively equipped on the respective blades 73. Selected insertion blades 73 are protruded by a requisite length (code r) in comparison with other blades by selectively driving the air cylinders 74.

Lock pins 75 are protruded with air cylinder 76 under the condition, and are passed through holes 73*a* of the respective blades 73. After the hand 70 approaches nearby the connector housing C under the condition, all the blades 73 proceed by the air cylinder 77, and only the selected blades 73 push the terminals t and insert them in the cavities a of the connector housing C as shown in FIG. 13(*b*). In FIG. 5 and FIG. 6, 74*a* are coil springs for returning the blades 73.

Further, as shown in FIG. 5 and FIGS. 13(*b*) and 13(*c*), the end parts 73*b* of the selected blades 73 engage the end faces of the corresponding terminals t to which the electric wires a are connected. The terminals t are supported by the end parts 73*b* and, therefore, even though they are being pulled backward by the weight of the electric wires a, the terminals t are transferred without being inclined.

Figure 4:
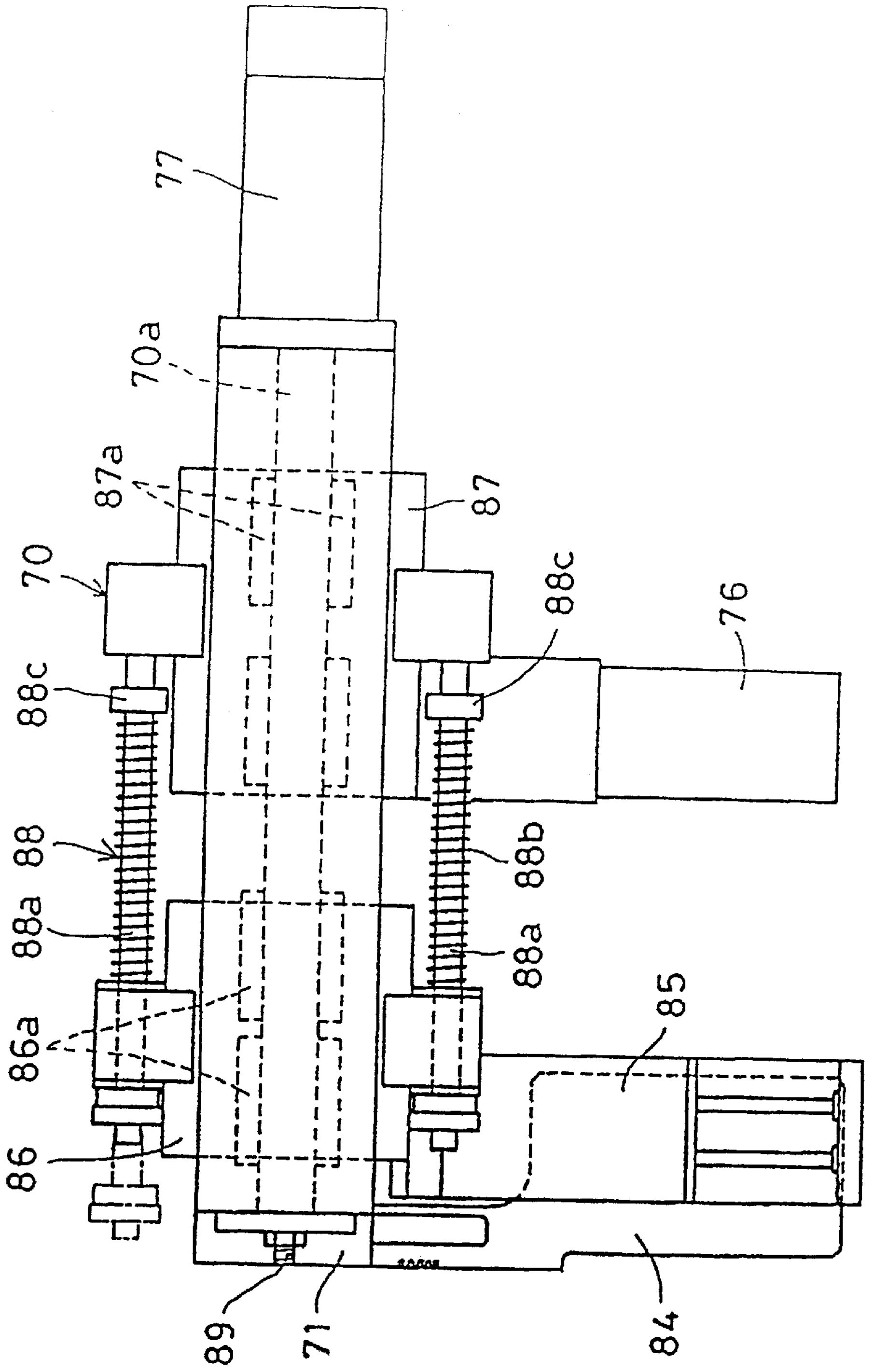
FIG. 4 is a plan view of the hand part of the terminal-mounting part shown in FIGS. 2 and 3.

As shown in FIG. 4 and FIG. 5 at this time, member 86 having the terminal-inserting jig 71 and member 87 with which the rod of the cylinder 77 is connected are arranged to freely slide through the sliders 86*a* and 87*a* in back and forth directions along the rails 70*a* of the hand base, and are connected with the expand shafts 88.

One end of the shafts 88*a* of the expand shafts 88 is supported by one side of a protrusion part of the member 86 under free advancing and retreating, and the other end is fixed by penetration through a protrusion part of the member 87. Coil springs 88*b* are fitted on the shafts 88*a*, lock rings 88*c* are fixed on the shafts 88*a* to provide abutments for one end of the springs 88*b*.

Accordingly, when the rod 77*a* of the cylinder 77 advances, both members 86 and 87 advance until one part of member 86 contacts with an adjustment screw 89, and after that, the other part of the member 87 proceeds against the biasing of the spring 88*b*. The blades 73 advance against the inserting jig 71, and push out the terminals t and insert them into the connector housings C.

Further, it may be better to guide the terminals t during the insertion. For this, as shown in the chain line of FIG. 11, guide protrusions 84*b* may be formed on the shutter 84 and at the insertion of the terminals t, stabilizers t' at both sides of the terminals t cross the guide protrusions 84*b*. Namely, the shutter 84 may preferably guide the insertion of terminals t. Thus, the terminals t are smoothly inserted without vibrating in a crosswise direction.

The selecting action of the respective blades 73 when inserting the terminals t in the connector housing C is the same as the selecting action of the respective press-connecting blades described in Japanese Patent Publication (unexamined) Hei No.10-106371.

Figure 15A:
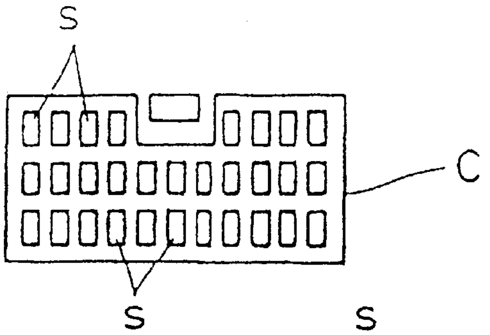
FIGS. 15(*a*) and 15(*b*) show a comparison of the terminal-inserting action of the present invention and the prior art.
Figure 15B:
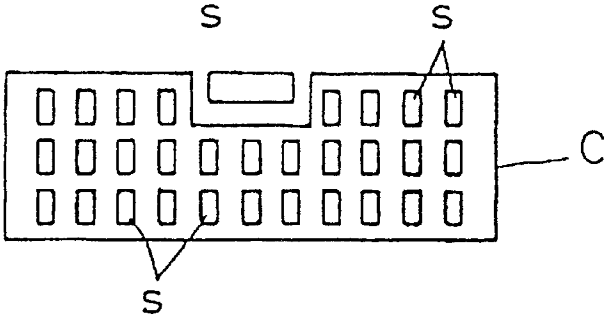
FIG. 15(b) PRIOR ART
Figure 26:
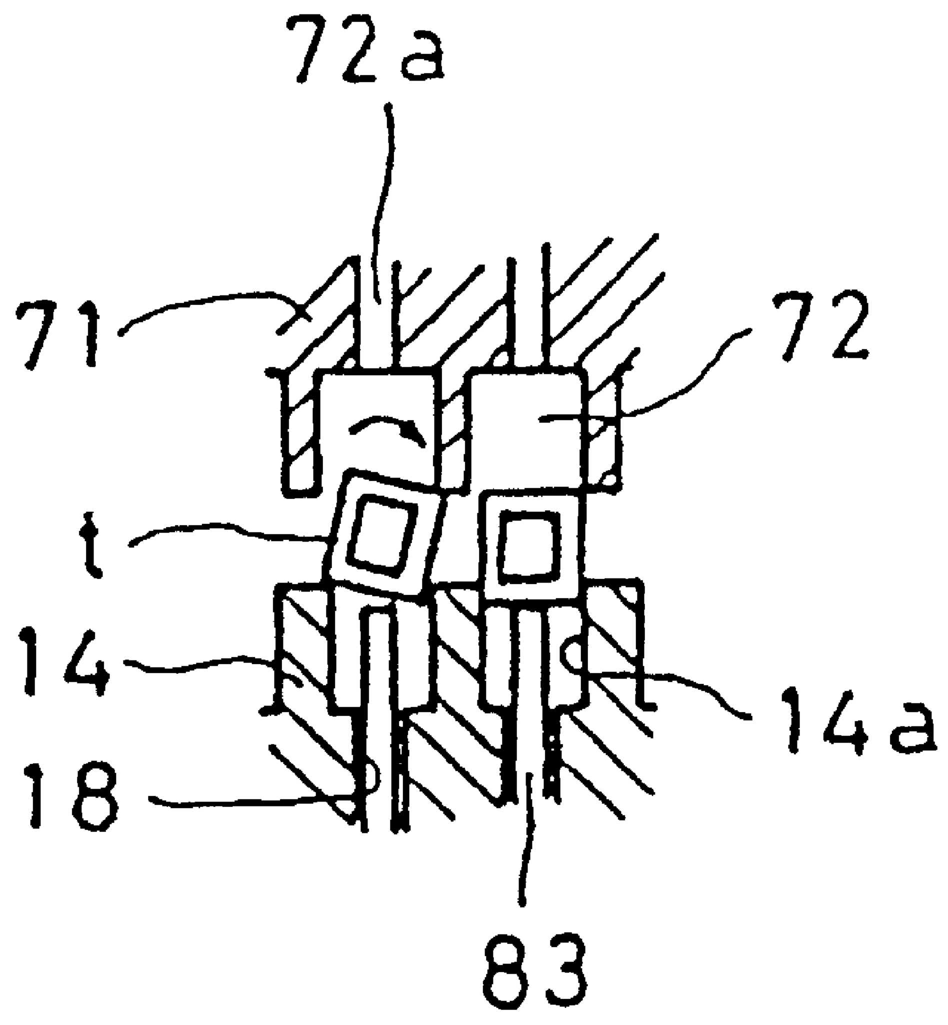
FIG. 26 shows a further detail of the delivery action to the inserting jig.
Figure 27A:
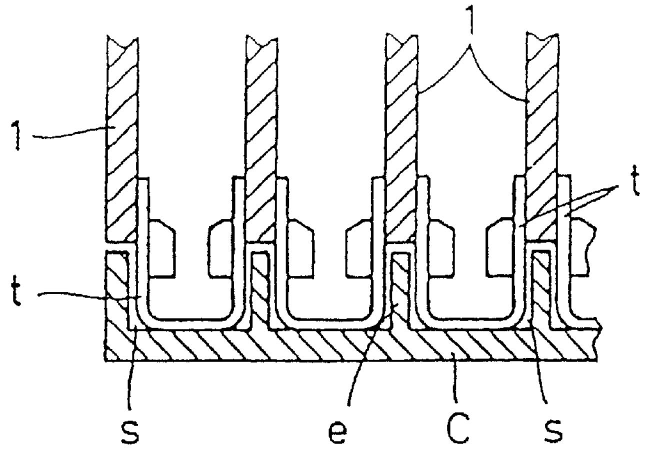
FIG. 27(a) PRIOR ART
FIGS. 27(*a*), 27(*b*) and 27(*c*) show a press-connecting action according to the prior art.
Figure 27B:
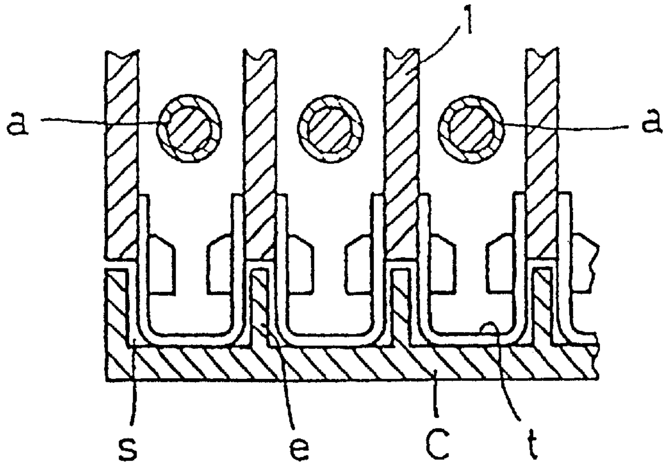
FIG. 27(b) PRIOR ART
Figure 27C:
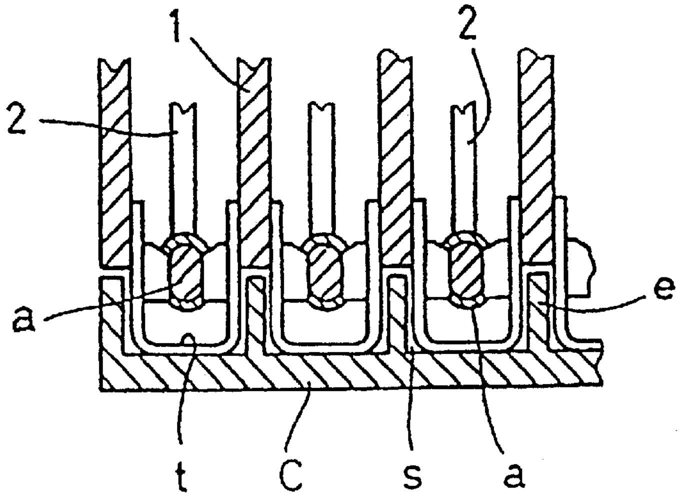
FIG. 27(c) PRIOR ART
Figure 29:
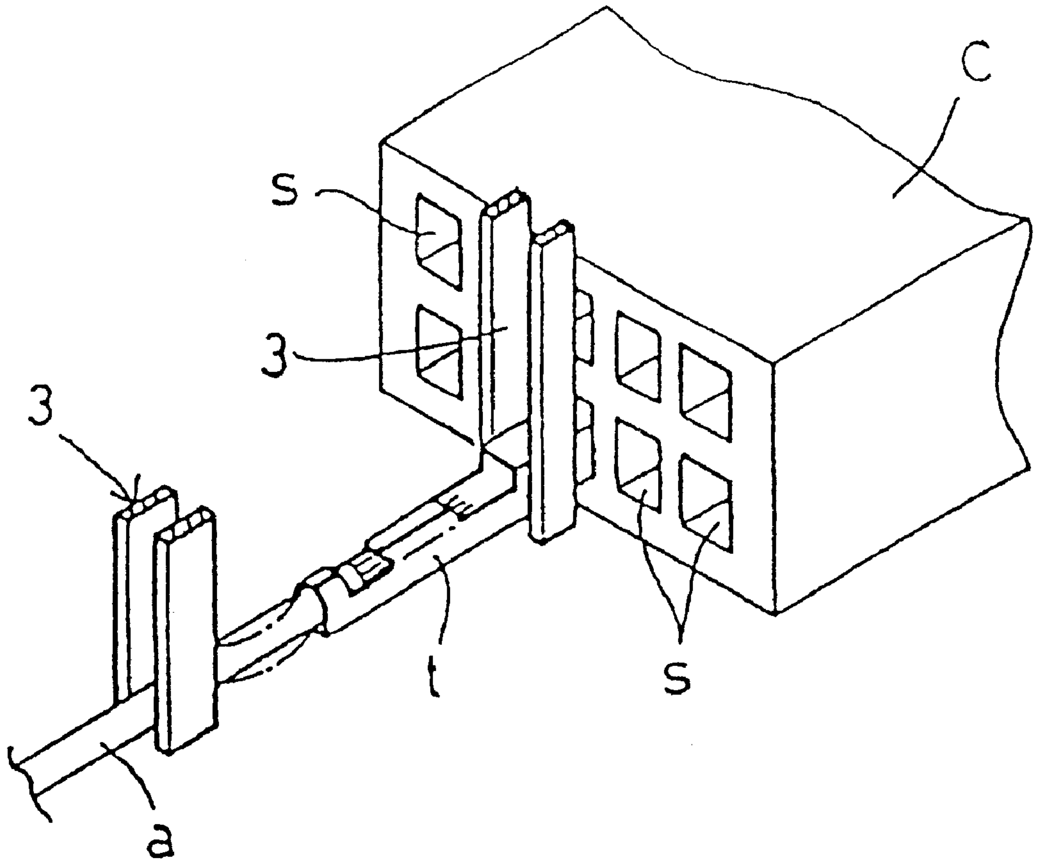
FIG. 29 PRIOR ART
FIG. 29 shows the mounting action of a press-clamping terminal according to the prior art.
Figure 30A:
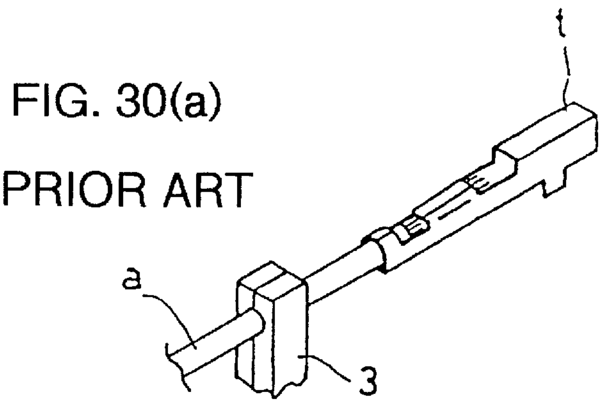
FIG. 30(a) PRIOR ART
FIGS. 30(*a*), 30(*b*) and 30(*c*) show further details of the mounting action according to the prior art.
Figure 30B:
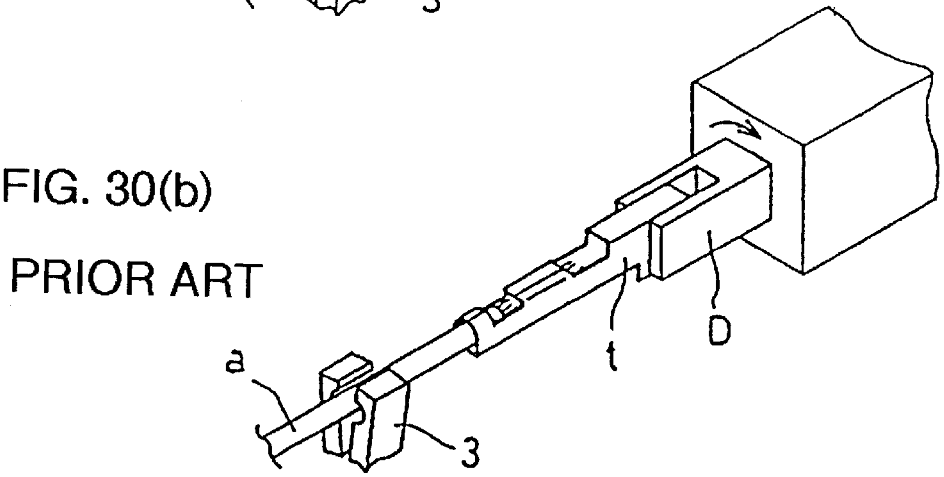
FIG. 30(b) PRIOR ART
Figure 30C:
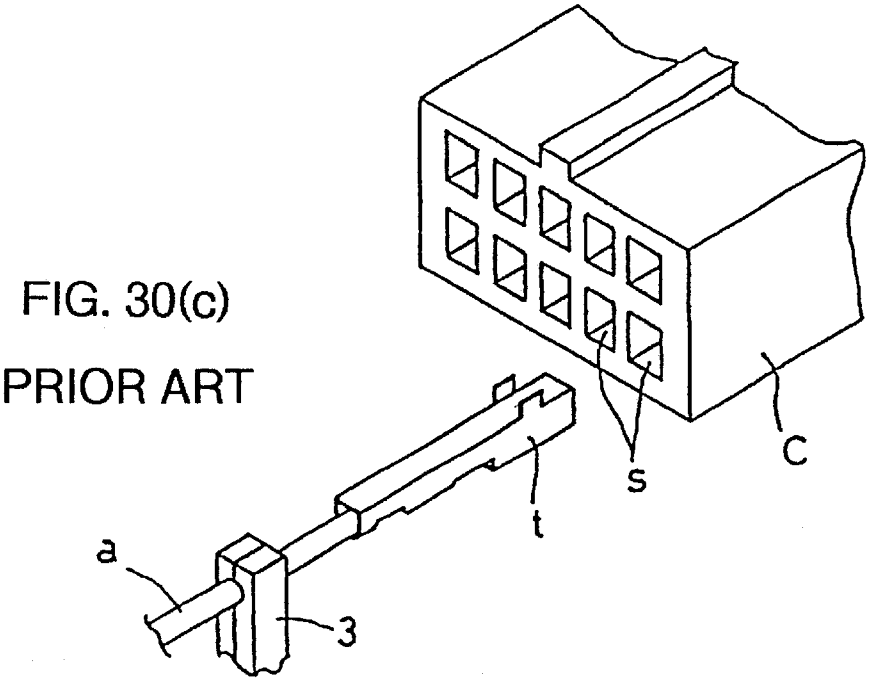
FIG. 30(c) PRIOR ART

Thus, as shown in FIG. 15(*a*), when the terminals t are inserted by pushing out the blades 73, closer spacing of the terminals t becomes possible by the cavities s of the connector housing C (FIG. 15(*a*)) having smaller pitch than the pitch (FIG. 15(*b*)) of the cavities a for inserting the press-clamping terminals t of FIG. 26, because no hand 3 (as in the prior art, FIG. 29) is required.

Further, as shown in FIG. 26, when a plural number of the terminals t are simultaneously mounted, the assembly time is remarkably shortened in comparison with the case of mounting the terminals one by one with the hand. For example, the assembly is limited by one by one mounting, and in addition, a mounting miss caused by a chucking miss is apt to occur.

Further, when the intervals of the cavities s are the same according to the selecting mechanism of the respective blades 73, housings C having different sizes and housings C having lock parts can be corresponded, and when the intervals of the cavities s are different, the appropriate array of insertion blades may be selected in the manner illustrated in FIGS. 13(*a*) and (*b*).

Figure 3:
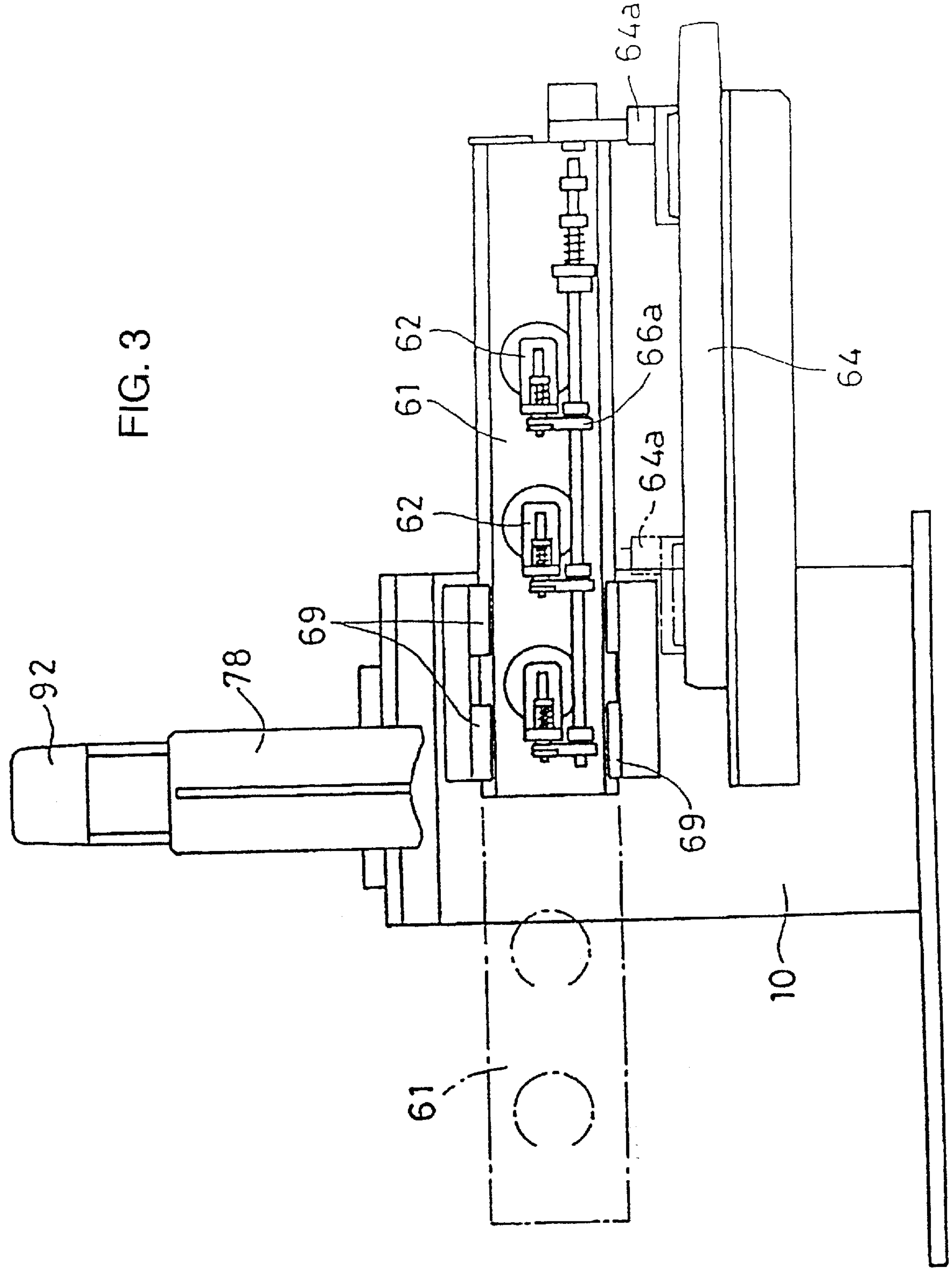
FIG. 3 is a partial front view of the terminal-mounting part shown in FIG. 2.

As shown in FIG. 2 and FIG. 3, the above-mentioned connector housing retention plate 61 is supported to freely slide in left and right directions by guides 69 arranged on the base stand 10. One end of the plate 61 is fixed on moving part 64*a* of slide actuator 64 arranged on the base stand 10 and moves to left and right as shown in the chain line of FIG. 3. The migration positions are 6 points in total including 3 points at which housing retention frames 62 described later correspond respectively with the terminal-mounting position 0, and 3 points from which they retreat at a requisite distance.

As shown in FIG. 3 and FIG. 9, the connector housing retention plate 61 is equipped with the housing retention frames 62 capable of free rotation. The housing retention frames 62 have protrusions 65 which support the housings C by pushing and springs 65*a* which bias the protrusions 65. After stop rings 66 of the protrusions 65 are pulled and the housing C is fitted on the retention frames 62, the housings C are pushed by the springs 65*a* by removing the protrusions 65 (the stop rings 66) and positively fixed. The pressing power is regulated by the thrusting amount of the stop rings 66. The protrusions 65 are fitted in the regulators 66*a* and provide the housing retention frames 62 at the mounting position, the cavities s of the I stage of the housing C become the terminal-inserting position.

Figure 16A:
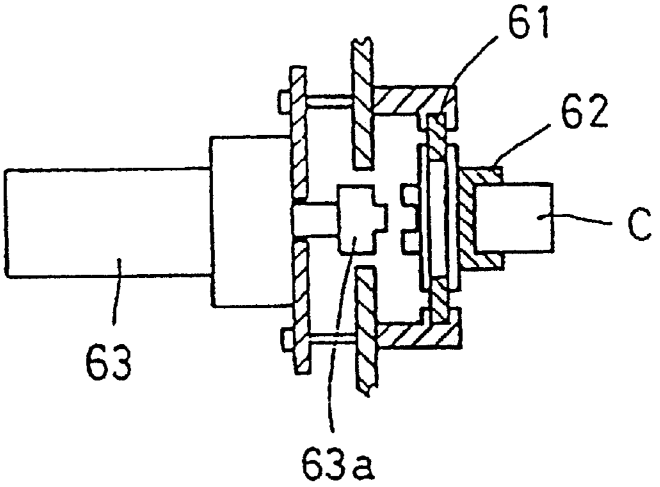
FIGS. 16(*a*) and 16(*b*) are schematic cross-section and exploded perspective views, respectively, of the retention-rolling part of the connector housing.
Figure 16B:
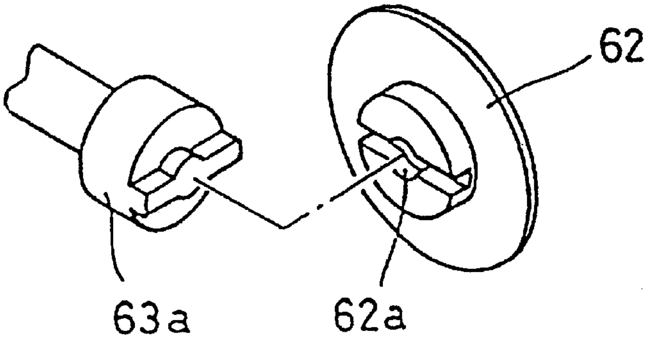

As shown in FIG. 2 and FIG. 16, the upper frame of the base stand 10 at the rear of the connector housing-retaining plate 61 is equipped with rotary cylinder 63 at the insertion position 0. When a drive part 63*a* of the rotary cylinder 63 rotates while being fitted in a drive hole 62*a* of the housing-retaining frames 62, the connector housing C rotates by 180 degrees as from (a) to (b) of FIG. 17, and is inverted (rolled). This operation is carried out for the respective retention frame of the retention plate 61.

At this time, concerning the rotation of the rotary cylinder 63 as shown in FIG. 9, when the protrusions 65 are fitted in the regulators 66*a*, the cavities s of the I stage becomes the inserting position by the fitting as afore-mentioned, but when it is rolled, the rotation position is regulated by the cylinder 63 itself so that the cavities a of the other stage becomes the inserting position.

Accordingly, the terminals t facing the connector housings C by the above-mentioned hand 70 are inserted in the cavities s of the housings C at the insertion position 0 from the back in accordance with the advancing of the blades 73 and mounted.

When the terminals t are inserted in the I stage of the I housing C, the retention plate 61 moves by a requisite amount to left or right, the insertion hand 70 transfers to a motion of inserting the next terminals t with electric wires. The retreat of the afore-mentioned inserted housings C is carried out for preventing the entanglement of the electric wires a at receiving.

After completion of the inserting, the retention plate 61 moves so that the I housing C becomes the insertion position, then the I housing C is rolled and the insertion of the terminals t is carried out again. At this time, the insertion hand 70 is elevated in accordance with the migration of the retention plate 61, is positioned so that it does not interfere with the rolling action, and transfers to the inserting position by descending after the roll of the housings C.

As shown in FIGS. 18(*a*), (*b*) and (*c*), these actions insert the terminals t of the jigs 14 in the pallets 12 in sequence so that terminals t of jig a are inserted into the upper stage a of the I housing C, then the terminals t of jig b are inserted into the lower stage b of the I housing, and successively, the terminals t of jigs c, d, c and f of the pallet 12 are inserted into the II housing C and the III housing C. The order of insertion is properly changed considering the wiring specification, the degree of entanglement and the like.

After completion of mounting the terminals t with electric wires into all of the connector housings C, the retention plate 61 moves to the right end, the connector housings C are removed from the retention frames 62 by a person or a robot and new connector housings C are mounted on the retention frames 62. On the other hand, the jig pallet 12 is transferred to the terminal-mounting machine 20. The flow chart of the actions above is shown in FIG. 20.

Thus, the reason why the terminals t are inserted by rolling the connector housings C is to mount the terminals t arranged on the jig pallets 12 in parallel to the same direction so that the backs of the upper terminals and lower terminals face each other. When the directions are the same, the rolling is unnecessary. For example, the insertion of the terminals t whose backs face each other has been carried out after rolling. Further, the cavities are not limited to two stages, one stage may be used, and three stages or more may also be used. In the respective cases, the motion of the elevation of the insertion hand 70 and the like corresponds with the number of stages.

For example, according to the above-mentioned terminal-mounting, the wire harness W shown in FIG. 21 can be obtained. This is the wire harness in which the terminals t are inserted from the back of the cavities s in like manner as the wire harness W by the press-clamping terminals. Accordingly, when a mode of operation capable of mounting the press-clamping terminals t in the connector housings C for the press-clamping terminals is set, the press-clamping terminals and the connector housings C can be used in common. Further, when there are the empty cavities a, not only the press-connecting terminals but also the press-clamping terminals can be also inserted (mounted) in the empty cavities s.

Figure 22A:
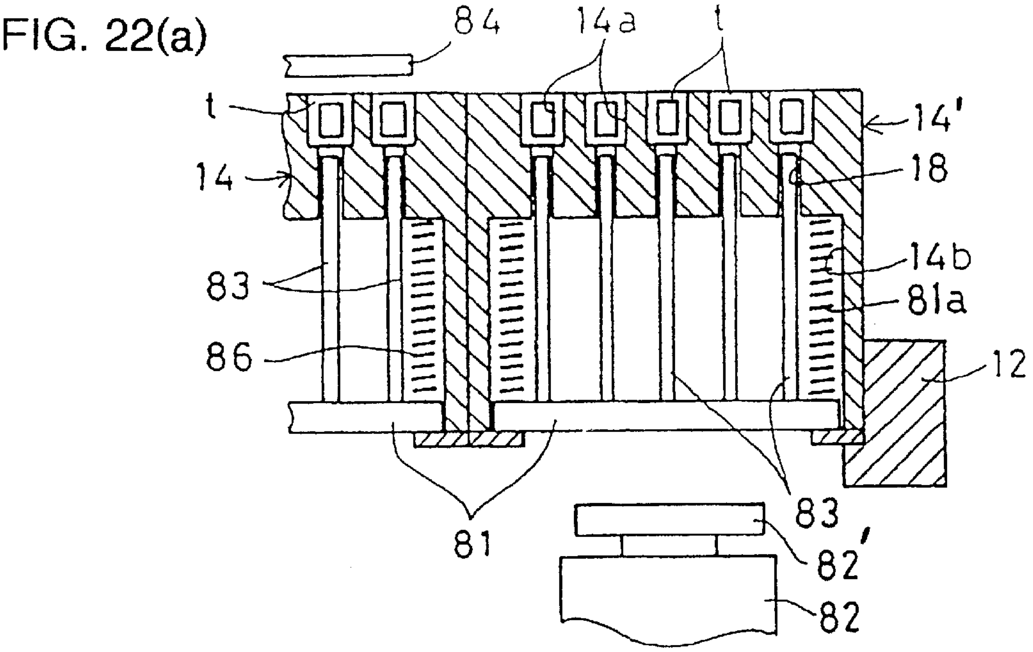
FIGS. 22(*a*) and 22(*b*) show an alternative connecting jig before and after transfer of the terminals to the inserting jig.
Figure 22B:
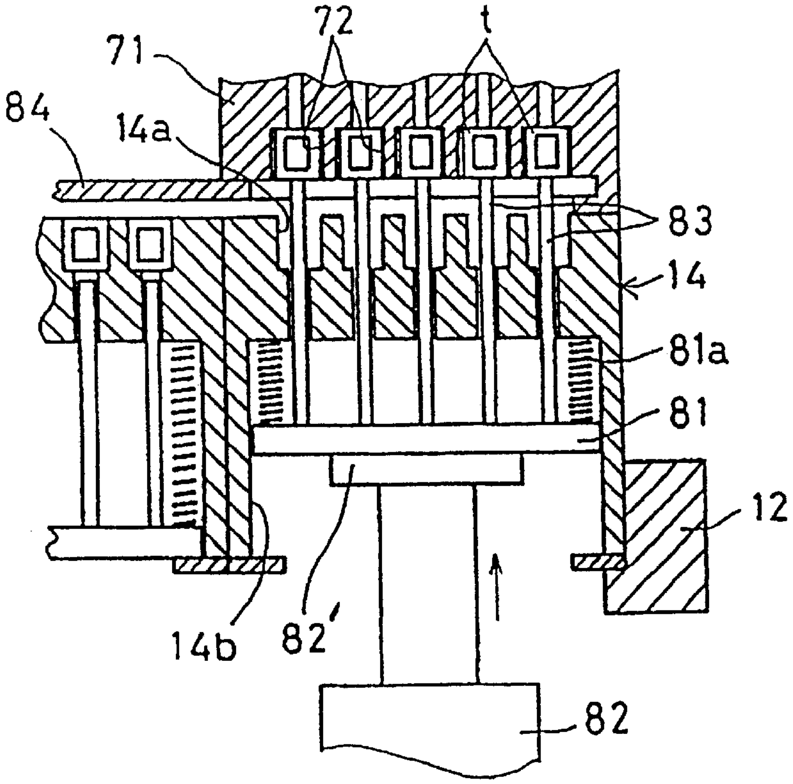
Figure 23A:
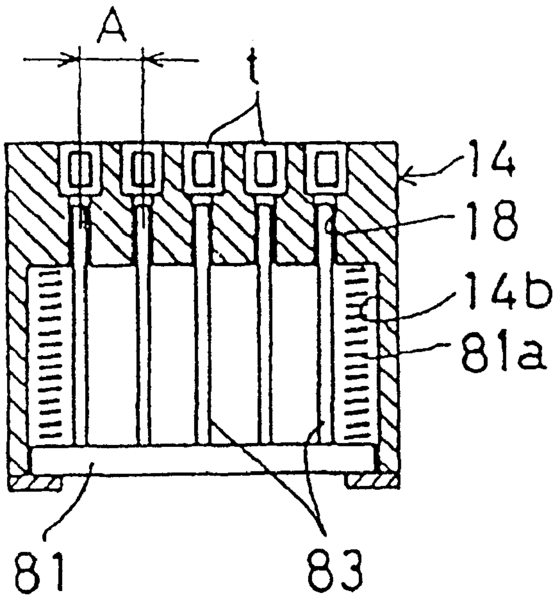
FIGS. 23(*a*) and 23(*b*) show another detail of the connecting jig shown in FIGS. 22(*a*) and 22(*b*)
Figure 23B:
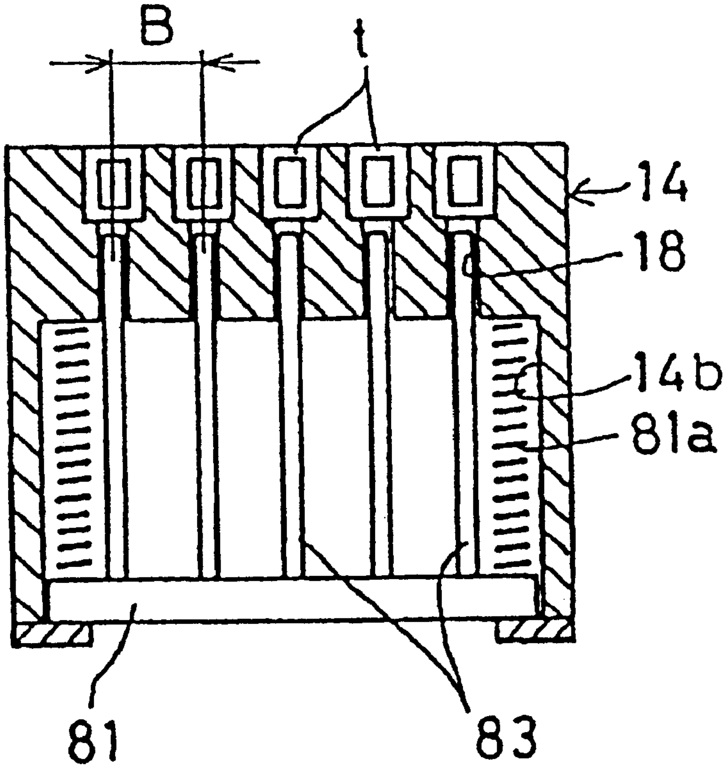

Other examples of the retaining jigs 14 are shown in FIG. 22 and FIG. 23. In this arrangement the jigs 14 are provided with the protruding pins (pushing-up pins) 83. Namely, recesses 14*b* are formed under the jig base 14', and pushing-up plates (protruding jigs) 81 with the above-mentioned pins 83 are fitted in the recesses 14*b* under a condition of free elevation. The plates 81 are designed to be pushed up by the air cylinders 82, and the pins 83 are designed to be retracted from the cavities 14*a* by the biasing of springs 86.

In this mode of operation, the pushing-up plates 81 and the pins 83 are pushed up by the elevation of the piston rods 82' of the air cylinders 82 as shown in FIG. 22(*b*), and the terminals t are pushed out (protruded) from the cavities 14*a* by the pins 83 and delivered to the inserting jig 71.

Even if the cavities 5 of the connector housings C are changed from FIG. 23(*a*) to FIG. 23(*b*) (even if the width of the cavities is changed from A to B (A<B)), by installing the pins 83 on the retaining jigs 14 like this, only changing the jigs 14 is required to correspond with the connector housings C.

By contrast with the mode of operation of FIG. 12 not only must the jigs 14 be changed but also the pushing-up plates (protruding jigs) 81 with the pins 83 from the air cylinders 82 must be changed. This requires a tool-changing mechanism. It becomes a working in the base stand in hand-working, and troublesome.

Figure 25A:
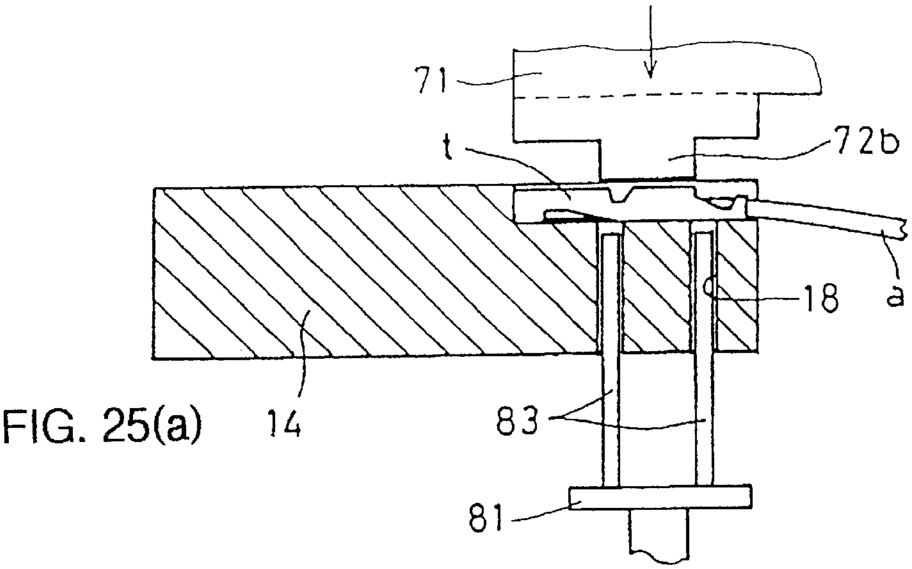
FIGS. 25(*a*), 25(*b*) and 25(*c*) show details of the delivery action to the inserting jig of FIG. 24.
Figure 25B:
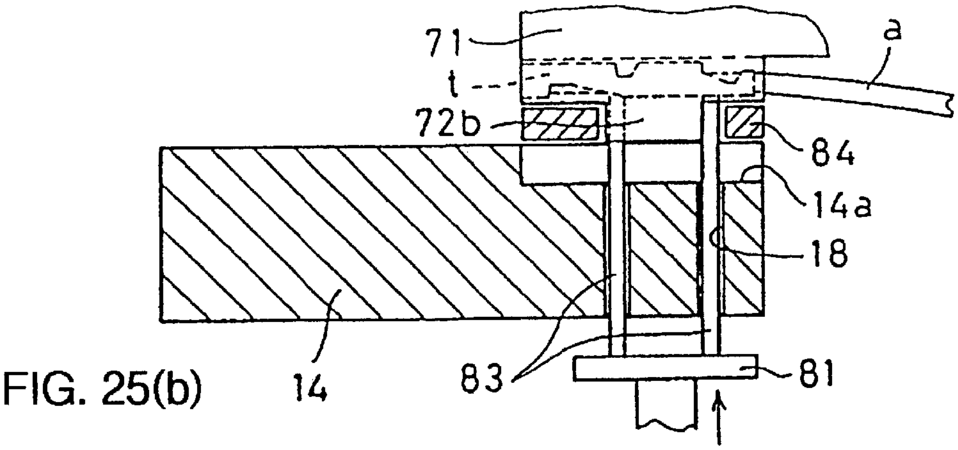
Figure 25C:
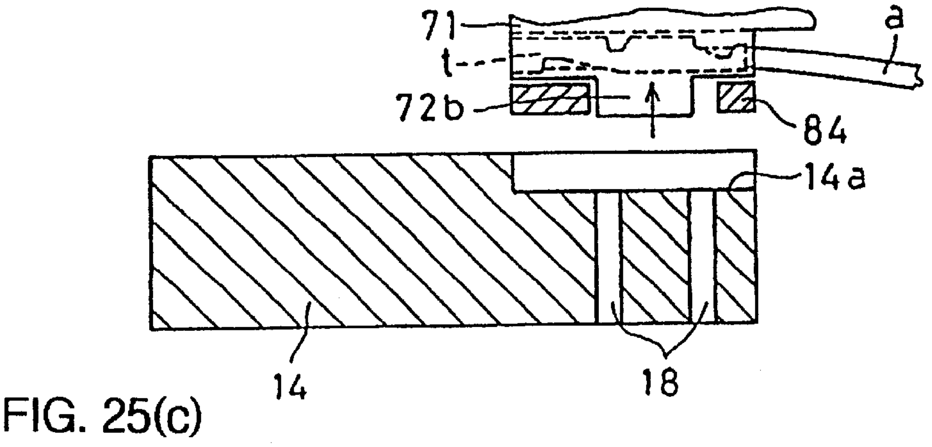

Another example of the inserting jig 71 is shown in FIG. 24 and FIG. 25, in which transfer mounting guides 72*b* are provided on the lower face of the jig 71 on both sides of the cavities 72. As shown in FIG. 26, in the absence of the guides 72*b*, the presence of the shutter 84 creates gaps between the connector jig 14 and inserting jig 71. If a twisting force is generated in the electric wires when the terminals tare pushed up from connector jig 14 by the pins 83, the terminals t are subject to rolling by the twisting force as shown by the arrow mark and there is a risk this may cause a delivery miss. However, as shown in FIG. 24 and FIG. 25, the terminals t are guided by the guides 72*b* during the transfer from the connector jig 14 to the inserting jig 71. In this way, the terminals t are smoothly transferred from the cavities 14*a* of the connector jig 14 to the cavities 72 of the inserting jig 71 without rolling.

Further, if the width of the cavities 14*a* of the connector jigs 14, the width of the cavities 72 of the inserting jig 71, and the width of the cavities s of the housings C are selected to be enlarged in this order, the terminals t having a narrowed transverse width are inserted in the broader cavities in turn, and the inserting action becomes smooth.

Further, if the press-clamping can be carried out in the retaining jigs 14, a similar effect as the above-mentioned press-connecting can be obtained in the press-clamping terminals.

As the present invention is the retaining jigs above, the press-connecting and the like are carried out in the jigs and the terminals can be mounted on the connector housings, the press-connecting terminals and the press-clamping terminals can be mounted on the I connector housing, and the common-usability of the housing and reduced costs can result. Thus, the costs of electric wires with a connector, for example, a wire harness, can be reduced.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present disclosure relates to subject matter contained in priority Japanese Application Nos. HEI-11-048767, filed on Feb. 25, 1999, HEI-11-143090, filed on May 24, 1999, HEI-11-143463, filed on May 24, 1999, HEI-11-143212, filed on May 24, 1999, and HEI-11-143448, filed on May 24, 1999, which are herein expressly incorporated by reference in their entireties.

What is claimed is:

1. A process for mounting a plurality of press-connecting terminals with electric wires into a connector housing, said connector housing having a front portion and a back terminal inserting portion, comprising:

individually loading each of a predetermined number of a plurality of said terminals into a respective one of a predetermined number of cavities in a terminal-connecting jig;

then connecting respective electric wires to respective terminals in the terminal-connecting jig;

then removing all of the terminals, with the electric wires connected thereto, from the terminal-connecting jig and inserting the terminals with electric wires connected thereto into a terminal inserting jig, wherein the terminals with electric wires connected thereto are removed from the terminal-connecting jig and inserted into the terminal inserting jig in a first, upward, direction; and subsequently removing the terminals with electric wires connected thereto from the terminal inserting jig and inserting the terminals with the electric wires connected thereto into cavities of the connector housing from the back terminal inserting portion of the connector housing, wherein the terminals with electric wires connected thereto are removed from the terminal inserting jig and inserted into cavities of the connector in a second direction substantially axial with axes of the wires.

2. The process as set forth in claim 1, wherein the individually loading of each of a plurality of said terminals into respective cavities in the terminal connecting jig, the connecting of the respective electric wires to the respective terminals, the removing of all of the terminals with the electric wires from the terminal-connecting jig, and the inserting of the terminals with the electric wires into cavities of the connector housing are carried out automatically.

3. The process according to claim 1, wherein the housing has two stages, an upper stage and a lower stage, and the housing is inverted for inserting the terminals with the electric wires into the cavities of the connector housing in the upper and lower stages.

4. The process as set forth in claim 1, further comprising transferring the terminals with the electric wires to a terminal-inserting jig from the terminal-connecting jig, and inserting the terminals with the electric wires into the cavities of the connector housing from the terminal-inserting jig.

5. The process as set forth in claim 4, further comprising, while loading the terminals with electric wires into cavities in the terminal connecting jig, preventing the terminals from falling out of the cavities in the terminal connecting jig by protrusions on spring plates positioned below the cavities in the terminal connecting jig.

6. The process as set forth in claim 4, further comprising transferring the terminals with the electric wires from the connecting jig to the inserting jig by pushing pins of a pushing-out jig through holes below the terminals in the connecting jig.

7. The process as set forth in claim 6, wherein each terminal with the electric wire is transferred by two pins which contact the terminal with the electric wire in a longitudinal direction at a front and rear of a connecting area of the electric wires.

8. The process as set forth in claim 4, further comprising transferring the terminals with the electric wires from the connecting jig to cavities in the inserting jig and preventing the terminals from falling out of the cavities by a shutter.

9. The process as set forth in claim 8, further comprising guiding the terminals when the terminals with the electric wires are inserted into the cavities of the connector housing from the terminal inserting jig by guides on the shutter.

10. The process as set forth in claim 8, wherein each terminal with the electric wire is transferred from the connecting jig to the inserting jig by pushing pins of a pushing-out jig through holes below the terminal with the electric wire in the connecting jig, and further comprising providing a clearance in the shutter for the pushing pins.

11. The process as set forth in claim 8, further comprising guiding the terminals with the electric wires when transferred to the inserting jig by transfer guides between the cavities.

12. The process as set forth in claim 4, wherein each of the terminals includes a rear end face, and further comprising transferring the terminals with the electric wires from the inserting jig to the cavities of the connector housing by members which push out the terminals in a longitudinal direction and support rear end faces of the terminals.

13. A process for mounting a plurality of press-connecting terminals with electric wires into a connector housing, said connector housing having a front portion and a back terminal inserting portion, comprising:

individually loading each of a plurality of said terminals into respective cavities in a terminal-connecting jig;

then connecting respective electric wires to respective terminals in the terminal-connecting jig;

then removing all of the terminals, with the electric wires connected thereto, from the terminal-connecting jig;

subsequently inserting the terminals with the electric wires connected thereto into cavities of the connector housing from the back terminal inserting portion of the connector housing; and wherein the housing has two stages, an upper stage and a lower stage, and the housing is inverted for inserting the terminals with the electric wires into the cavities of the connector housing in the upper and lower stages.

* * * * *

UNITED STATES PATENT AND TRADEMARK OFFICE

CERTIFICATE OF CORRECTION

PATENT NO. : 6,612,026 B1
DATED : September 2, 2003
INVENTOR(S) : K. Fujita et al.

It is certified that error appears in the above-identified patent and that said Letters Patent is hereby corrected as shown below:

Title page,
Item [56], References Cited, please insert:--

| | | | |
|---|---|---|---|
| -- 5,201,665 | 4/1993 | McCardell et al. | 439/157 |
| 5,139,446 | 8/1992 | Costello et al. | 439/751 |
| 4,997,385 | 3/1991 | Casagrande, Mario | 439/259 |
| 4,904,212 | 2/1990 | Durbin et al. | 439/751 |
| 4,742,612 | 5/1988 | Dokan et al. | 29/739 |
| 4,670,978 | 6/1987 | Fickes et al. | 29/741 -- |

Signed and Sealed this

Eleventh Day of May, 2004

JON W. DUDAS
*Acting Director of the United States Patent and Trademark Office*